United States Patent
Milano et al.

(10) Patent No.: US 9,910,088 B2
(45) Date of Patent: Mar. 6, 2018

(54) METHODS AND APPARATUS FOR SENSOR DIAGNOSTICS INCLUDING PROGRAMMABLE SELF-TEST SIGNALS

(71) Applicant: ALLEGRO MICROSYSTEMS, LLC, Worcester, MA (US)

(72) Inventors: Shaun D. Milano, Dunbarton, NH (US); Georges El Bacha, Manchester, NH (US); Michael C. Doogue, Bedford, NH (US); William P. Taylor, Amherst, NH (US)

(73) Assignee: ALLEGRO MICROSYSTEMS, LLC, Worcester, MA (US)

( * ) Notice: Subject to any disclaimer, the term of this patent is extended or adjusted under 35 U.S.C. 154(b) by 62 days.

(21) Appl. No.: 14/578,813

(22) Filed: Dec. 22, 2014

(65) Prior Publication Data

US 2015/0185279 A1    Jul. 2, 2015

Related U.S. Application Data

(60) Provisional application No. 61/920,827, filed on Dec. 26, 2013.

(51) Int. Cl.
*G01B 7/30* (2006.01)
*G01R 27/02* (2006.01)
(Continued)

(52) U.S. Cl.
CPC ..... *G01R 31/2884* (2013.01); *G01R 31/2829* (2013.01); *G01R 31/3187* (2013.01); *G01R 33/00* (2013.01); *G01R 33/0023* (2013.01); *G01R 33/02* (2013.01); *G01R 33/07* (2013.01); *G01R 33/09* (2013.01); *G01R 33/091* (2013.01); *G01R 35/00* (2013.01); *H01L 2224/48091* (2013.01); *H01L 2224/48247* (2013.01);
(Continued)

(58) Field of Classification Search
CPC .......... G01B 7/30; G01R 27/02; G01R 31/02; G01R 31/28; G01R 31/31
USPC ...... 324/207.21, 207.25, 500, 537, 555, 610
See application file for complete search history.

(56) References Cited

U.S. PATENT DOCUMENTS 4,236,832 A   12/1980   Komatsu et al.
4,438,347 A   3/1984   Gehring
(Continued)

FOREIGN PATENT DOCUMENTS

DE   38 29 815 A1   3/1990
DE   195 39 458 A1   4/1997
(Continued)

OTHER PUBLICATIONS

U.S. Appl. No. 14/506,024, filed Oct. 3, 2014, Petrie et al.
(Continued)

*Primary Examiner* — Arleen M Vazquez
*Assistant Examiner* — Neel Shah
(74) *Attorney, Agent, or Firm* — Daly, Crowley, Mofford & Durkee, LLP

(57) ABSTRACT

Methods and apparatus to provide an integrated circuit having a magnetic sensing element and fault detection module coupled to the sensing element, the fault detection module including circuitry to detect a fault condition and to self-test operation of the circuitry for detecting the fault condition. In illustrative embodiments, a fault pin indicates the fault condition.

28 Claims, 20 Drawing Sheets

(51) Int. Cl.
  *G01R 31/02* (2006.01)
  *G01R 31/28* (2006.01)
  *G01R 33/00* (2006.01)
  *G01R 31/3187* (2006.01)
  *G01R 33/02* (2006.01)
  *G01R 33/07* (2006.01)
  *G01R 33/09* (2006.01)
  *G01R 35/00* (2006.01)

(52) U.S. Cl.
  CPC ............. *H01L 2224/48257* (2013.01); *H01L 2924/181* (2013.01)

(56) References Cited

U.S. PATENT DOCUMENTS

| | | |
|---|---|---|
| 4,752,733 A | 6/1988 | Petr et al. |
| 4,758,943 A | 7/1988 | Aström et al. |
| 4,760,285 A | 7/1988 | Nelson |
| 4,823,075 A | 4/1989 | Alley |
| 4,833,406 A | 5/1989 | Foster |
| 4,970,411 A | 11/1990 | Halg et al. |
| 5,038,246 A | 8/1991 | Durivage, III |
| 5,247,278 A | 9/1993 | Pant et al. |
| 5,329,416 A | 7/1994 | Ushiyama et al. |
| 5,412,255 A | 5/1995 | Wallrafen |
| 5,424,558 A | 6/1995 | Borden et al. |
| 5,469,058 A | 11/1995 | Dunnam |
| 5,521,501 A | 5/1996 | Dettmann et al. |
| 5,621,319 A | 4/1997 | Bilotti et al. |
| 5,640,090 A | 6/1997 | Furuya et al. |
| 6,011,770 A | 1/2000 | Tan |
| 6,014,091 A | 1/2000 | Noltemeyer et al. |
| 6,262,871 B1 | 7/2001 | Nemir et al. |
| 6,351,506 B1 | 2/2002 | Lewicki |
| 6,392,478 B1 | 5/2002 | Mulder et al. |
| 6,436,748 B1 | 8/2002 | Forbes et al. |
| 6,437,558 B2 | 8/2002 | Li et al. |
| 6,853,178 B2 | 2/2005 | Hayat-Dawoodi |
| 6,896,407 B2 | 5/2005 | Nomiyama et al. |
| 6,917,321 B1 | 7/2005 | Haurie et al. |
| 7,038,448 B2 | 5/2006 | Schott et al. |
| 7,190,784 B2 | 3/2007 | Li |
| 7,259,545 B2 | 8/2007 | Stauth et al. |
| 7,292,096 B2 | 11/2007 | Burt et al. |
| 7,319,319 B2 | 1/2008 | Jones et al. |
| 7,323,870 B2 | 1/2008 | Tatschl et al. |
| 7,325,175 B2 | 1/2008 | Momtaz |
| 7,425,821 B2 | 9/2008 | Monreal et al. |
| 7,474,093 B2 | 1/2009 | Ausserlechner |
| 7,518,354 B2 | 4/2009 | Stauth et al. |
| 7,605,647 B1 | 10/2009 | Romero et al. |
| 7,635,993 B2 | 12/2009 | Boeve |
| 7,694,200 B2 | 4/2010 | Forrest et al. |
| 7,701,208 B2 | 4/2010 | Nishikawa |
| 7,729,675 B2 | 6/2010 | Krone |
| 7,746,056 B2 | 6/2010 | Stauth et al. |
| 7,746,065 B2 | 6/2010 | Pastre et al. |
| 7,764,118 B2 | 7/2010 | Kusuda et al. |
| 7,769,110 B2 | 8/2010 | Momtaz |
| 7,800,389 B2 | 9/2010 | Friedrich et al. |
| 7,923,996 B2 | 4/2011 | Doogue et al. |
| 7,936,144 B2 | 5/2011 | Vig et al. |
| 7,961,823 B2 | 6/2011 | Kolze et al. |
| 7,990,209 B2 | 8/2011 | Romero |
| 8,030,918 B2 | 10/2011 | Doogue et al. |
| 8,128,549 B2 | 3/2012 | Testani et al. |
| 8,134,358 B2 | 3/2012 | Charlier et al. |
| 8,269,491 B2 | 9/2012 | Cummings et al. |
| 8,447,556 B2 | 5/2013 | Friedrich et al. |
| 8,542,010 B2 | 9/2013 | Cesaretti et al. |
| 8,577,634 B2 | 11/2013 | Donovan et al. |
| 8,680,846 B2 | 3/2014 | Cesaretti et al. |
| 8,754,640 B2 | 6/2014 | Vig et al. |
| 9,046,562 B2 | 6/2015 | Cummings et al. |
| 2002/0084923 A1 | 7/2002 | Li |
| 2003/0038675 A1 | 2/2003 | Gailus et al. |
| 2003/0102909 A1 | 6/2003 | Motz |
| 2003/0164711 A1* | 9/2003 | Ishida ............... G01D 3/08 324/610 |
| 2003/0234652 A1 | 12/2003 | Bald |
| 2004/0056647 A1 | 3/2004 | Stauth et al. |
| 2005/0038623 A1 | 2/2005 | Hammerschmidt |
| 2005/0183489 A1 | 8/2005 | Weinberg et al. |
| 2006/0125622 A1 | 6/2006 | Baldwin et al. |
| 2006/0152210 A1 | 7/2006 | Mangtani et al. |
| 2006/0202692 A1 | 9/2006 | Tatschl et al. |
| 2007/0110199 A1 | 5/2007 | Momtaz et al. |
| 2007/0247141 A1 | 10/2007 | Pastre et al. |
| 2007/0285089 A1 | 12/2007 | Ibuki et al. |
| 2008/0094055 A1 | 4/2008 | Monreal et al. |
| 2008/0137784 A1 | 6/2008 | Krone |
| 2008/0238410 A1 | 10/2008 | Charlier et al. |
| 2009/0001964 A1 | 1/2009 | Strazalkowski |
| 2009/0001972 A1 | 1/2009 | Fernandez et al. |
| 2009/0085706 A1 | 4/2009 | Baarman et al. |
| 2009/0212765 A1 | 8/2009 | Doogue et al. |
| 2009/0251134 A1* | 10/2009 | Uenoyama ......... G01D 5/24466 324/207.21 |
| 2009/0278711 A1 | 11/2009 | Lohberg et al. |
| 2010/0211347 A1 | 8/2010 | Friedrich et al. |
| 2011/0018533 A1 | 1/2011 | Cesaretti et al. |
| 2011/0048102 A1 | 3/2011 | Fernandez et al. |
| 2011/0074016 A1 | 3/2011 | Narita |
| 2011/0298448 A1 | 12/2011 | Foletto et al. |
| 2012/0274314 A1 | 1/2012 | Cesaretti et al. |
| 2012/0313635 A1 | 12/2012 | Daubert |
| 2013/0214774 A1 | 8/2013 | Cesaretti et al. |
| 2013/0300406 A1 | 11/2013 | Pepka et al. |
| 2014/0184200 A1 | 7/2014 | Milano et al. |
| 2014/0266181 A1 | 9/2014 | Milano et al. |

FOREIGN PATENT DOCUMENTS

| | | |
|---|---|---|
| DE | 10 2006 037 226 A1 | 2/2008 |
| DE | 10 2007 041 230 B3 | 4/2009 |
| EP | 0289414 A2 | 11/1988 |
| EP | 0289414 A3 | 11/1988 |
| EP | 0357013 A2 | 3/1990 |
| EP | 0357013 A3 | 3/1990 |
| EP | 1032846 A1 | 9/2000 |
| EP | 1637898 A1 | 3/2006 |
| EP | 1679524 A1 | 7/2006 |
| EP | 1850143 A1 | 10/2007 |
| EP | 2 211 147 A1 | 7/2010 |
| GB | 2276727 A | 10/1994 |
| JP | H06 26968 A | 2/1994 |
| WO | WO 9602849 A1 | 2/1996 |
| WO | WO 2004/072672 | 8/2004 |
| WO | WO 2006/056829 | 6/2006 |
| WO | WO 2007/138508 A1 | 12/2007 |
| WO | WO 2008/048379 A1 | 4/2008 |
| WO | WO 2009/012006 A1 | 1/2009 |
| WO | WO 2009/108422 A2 | 9/2009 |
| WO | WO 2009/108422 A3 | 9/2009 |
| WO | WO 2010/096367 A1 | 8/2010 |
| WO | WO 2011/011479 | 1/2011 |
| WO | WO 2012/164915 | 12/2012 |

OTHER PUBLICATIONS

U.S. Appl. No. 14/337,613, filed Jul. 22, 2014, Scheller et al.
Office Action dated Mar. 19, 2015 for U.S. Appl. No. 13/730,100; 18 pages.
Response to Office Action filed on Aug. 24, 2015 for U.S. Appl. No. 13/730,100; 16 pages.
Response to Final Office Action filed Feb. 29, 2016 for U.S. Appl. No. 13/730,100; 6 pages.
Notice of Allowance dated Mar. 29, 2016 for U.S. Appl. No. 13/730,100; 10 pages.
Response to Office Action filed Feb. 29, 2016 for European Application No. 13812244.5; 22 pages.

(56) References Cited

OTHER PUBLICATIONS

Ausserlechner et al.; "Compensation of the Piezo-Hall Effect in Integrated Hall Sensors on (100)-Si;" IEEE Sensors Journal, vol. 7, No. 11; Nov. 2007; ISBN: 1530-437X; pp. 1475-1482.

Ausserlechner et al.; "Drift of Magnetic Sensitivity of Small Hall Sensors Due to Moisture Absorbed by the IC-Package;" Proceedings of IEEE Sensors, 2004; vol. 1; Oct. 24, 2004; ISBN:0-7803-8692-2; pp. 455-458.

Ausserlechner; "The piezo-Hall effect in n-silicon for arbitrary crystal orientation;" Proceedings of IEEE Sensors; vol. 3; Oct. 24, 2004; ISBN: 0-7803-8692-2; pp. 1149-1152.

Bahreyni, et al.; "A Resonant Micromachined Magnetic Field Sensor," IEEE Sensors Journal; vol. 7, No. 9, Sep. 2007; pp. 1326-1334.

Barrettino, et al.; "CMOS-Based Monolithic Controllers for Smart Sensors Comprising Micromembranes and Microcantilevers;" IEEE Transactions on Circuits and Systems-I Regular Papers vol. 54, No. 1; Jan. 2007; pp. 141-152.

Baschirotto et al.; "Development and Analysis of PCB Vector 2-D Magnetic Field Sensor System for Electronic Compass;" IEEE Sensors Journal vol. 6, No. 2; Apr. 2006; pp. 365-371.

Bilotti et al.; "Monolithic Magnetic Hall Sensor Using Dynamic Quadrature Offset Cancellation;" IEEE Journal of Solid-State Circuits; vol. 32, Issue 6; Jun. 1997; pp. 829-836.

Demierre, et al.; "Reference Magnetic Actuator for Self-Calibration of a Very Small Hall Sensor Array;" Sensors and Actuators A97-98; Apr. 2002; pp. 39-46.

Frick, et al.; "CMOS Microsystem for AC Current Measurement with Galvanic Isolation;" IEEE Sensors Journal; vol. 3, No. 6; Dec. 2003; pp. 752-760.

Halg; "Piezo-Hall Coefficients of n-Type Silicon;" Journal of Applied Physics; vol. 64, No. 1; Jul. 1, 1988; pp. 276-282.

Hosticka; "CMOS Sensor Systems;" Sensors and Actuators A66; Apr. 1998; pp. 335-341.

Kanda et al.; "The Piezo-Hall Effect in n-Silicon;" $22^{nd}$ International Conference on the Physics of Semiconductors; vol. 1, Jan. 1995; pp. 89-92.

Krammerer et al.: "A Hall effect sensors network insensitive to mechanical stress;" Proceedings of IEEE Sensors; vol. 3, Oct. 2004; pp. 1071-1074.

Mangnani et al.; "Mechanical Stress Measurement Electronics Based on Piezo-Resistive and Piezo-Hall Effects;" $9^{th}$ International Conference on Electronics, Circuits and Systems 2002; vol. 1; SBN: 0-7803-7596-3; Dec. 2002; pp. 363-366.

Manic et al.; "Short and Long-Term Stability Problems of Hall Plates in Plastic Packages;" IEEE $38^{th}$ Annual International Reliability Physics Symposium; Apr. 2000; pp. 225-230.

Manic; "Drift in Silicon Integrated Sensors and Circuits Due to the Thermo-Mechnical Stresses;" Lausanne, Ecole Polytechnique Federale De Lausanne 2000; 170 pages.

Motz et al.; "An Integrated Magnetic Sensor with Two Continuous-Time ΔE-Converters and Stress Compensation Capability;" IEEE International Solid-State Circuits Conference; Digest of Technical Papers; Feb. 6, 2006; ISBN: 1-4244-0079-1; pp. 1151-1160.

Motz, et al.; "A Chopped Hall Sensor with Small Jitter and Programmable "True Power-On" Function;" IEEE Journal of Solid-State Circuits; vol. 40, No. 7; Jul. 2005; pp. 1533-1540.

Motz, et al.; "An Integrated Hall Sensor Platform Design for Position, Angle and Current Sensing;" IEEE Sensors 2006; Exco, Daegu, Korea / Oct. 22-25, 2006; pp. 1008-1011.

Munter; "A Low-offset Spinning-current Hall Plate;" Sensors and Actuators A21-A23; 1990; pp. 742-746.

Munter; "Electronic Circuitry for a Smart Spinning-current Hall Plate with Low Offset;" Sensors and Actuators A; Jun. 1991;.pp. 747-751.

Partin et al.; "Temperature Stable Hall Effect Sensors;" IEEE Sensors Journal, vol. 6, No. 1; Feb. 2006; pp. 106-110.

Pastre, et al.; "A Hall Sensor Analog Front End for Current Measurement with Continuous Gain Calibration;" IEEE Sensors Journal; vol. 7, No. 5; May 2007; pp. 860-867.

Pastre, et al.; "A Hall Sensor-Based Current Measurement Microsystem With Continuous Gain Calibration;" Research in Microelectronics and Electronics, IEEE vol. 2; Jul. 25, 2005; ISBN: 0-7803-9345-7; pp. 95-98.

PCT International Preliminary Report on Patentability and Written Opinion dated Sep. 10, 2010 for PCT/US2009/031776.

PCT Search Report and Written Opinion of the ISA for PCT/US2009/031776 dated Oct. 23, 2009.

PCT Search Report and Written Opinion of the ISA for PCT/US2010/024256 dated Aug. 11, 2010.

Popovic; "Sensor Microsystems;" Proc. $20^{th}$ International Conference on Microelectronics (MWIL 95); vol. 2, NIS, Serbia, Sep. 12-14, 1995; pp. 531-537.

Preliminary Amendment filed on Oct. 5, 2010 for U.S. Appl. No. 12/706,318.

PTO Notice of Allowance dated Feb. 11, 2011 for U.S. Appl. No. 12/037,393.

PTO Notice of Allowance dated Jul. 19, 2011 for U.S. Appl. No. 12/959,672.

PTO Office Action dated Feb. 2, 2011 from U.S. Appl. No. 12/959,672.

Randhawa; "Monolithic Integrated Hall Devices in Silicon Circuits;" Microelectronics Journal; vol. 12, No. 6; Sep. 14-17, 1981; pp. 24-29.

Ruther et al; "Integrated CMOS-Based Sensor Array for Mechanical Stress Mapping;" $5^{th}$ IEEE Conference on Sensors, Oct. 2007: pp. 1131-1134.

Ruther et al.; "Theromagnetic Residual Offset in Integrated Hall Plates;" IEEE Sensors Journal; vol. 3, No. 6; Dec. 2003; pp. 693-699.

Schneider; "Temperature Calibration of CMOS Magnetic Vector Probe for Contactless Angle Measurement System," IEDM 1996 pp. 533-536.

Schott et al.; "Linearizing Integrated Hall Devices;" 1997 International Conference on Solid-State Sensors and Actuators, Jun. 16-19, 1997; pp. 393-396.

Schott, et al.; "CMOS Single-Chip Electronic Compass with Microcontroller;" IEEE Journal of Solid-State Circuits; vol. 42, No. 12; Dec. 2007; pp. 2923-2933.

Simon et al.; "Autocalibration of Silicon Hall Devices;" $8^{th}$ International Conference on Solid-State Sensors and Actuators; vol. 2; Jun. 25, 1995; pp. 237-240.

Steiner et al.; "Double-Hall Sensor with Self-Compensated Offset;" International Electron Devices Meeting; Dec. 7, 1997; ISBN: 0-7803-4100-7; pp. 911-914.

Steiner et al; Offset Reduction in Hall Devices by Continuous Spinning Current Method; Sensors and Actuators A66; 1998; pp. 167-172.

Stellrecht et al.; Characterization of Hygroscopic Swelling Behavior of Mold Compounds and Plastic Packages; IEEE Transactions on Components and Packaging Technologies; vol. 27, No. 3; Sep. 2004; pp. 499-506.

Tian et al.; "Multiple Sensors on Pulsed Eddy-Current Detection for 3-D Subsurface Crack Assessment;" IEEE Sensors Journal, vol. 5, No. 1; Feb. 2005; pp. 90-96.

Trontelj et al; "CMOS Integrated Magnetic Field Source Used as a Reference in Magnetic Field Sensors on Common Substrate;" WEP 1-6; IMTC; May 1994; pp. 461-463.

Udo; "Limits of Offset Cancellation by the Principle of Spinning Current Hall Probe;" Proceedings of IEEE Sensors; Oct. 2004; pp. 1117-1120.

Zou et al.; "Three-Dimensional Die Surface Stress Measurements in Delaminated and Non-Delaminated Plastic Packages;" 48th Electronic Components and Technology Conference; May 25, 1998; pp. 1223-1234.

U.S. Appl. No. 12/037,393, filed Feb. 26, 2008, Michael C. Doogue, et al.

U.S. Appl. No. 12/959,672, filed Dec. 3, 2010, Michael C. Doogue, et al.

U.S. Appl. No. 13/095,371, filed Apr. 27, 2011, Cesaretti et al.

U.S. Appl. No. 13/398,127, filed Jan. 16, 2012, Cessaretti et al.

U.S. Appl. No. 13/743,451, filed Jan. 17, 2013, Friedrich et al.

(56) References Cited

OTHER PUBLICATIONS

EP Official Communication; dated Feb. 23, 2012; for EP. Pat. App. No. 10739429.8; 2 pages.
European Notice of Allowance; dated Jan. 4, 2013; for European Pat. App. No. 10739429.8; 7 pages.
European Response to Written Opinion dated Sep. 4, 2012 for European Patent Application No. 10739429.8, 11 pages.
Letter from NTD Patent and Trademark Agency Ltd.; dated Jan. 19, 2013; enclosing Response to Official Action; for Chinese Pat. App. No. 200980106535.4; 13 pages.
Letter to NTD Patent and Trademark Agency Ltd.; dated Dec. 11, 2012; with instructions to file Response to Official Action; for Chinese Pat. App. No. 200980106535.4; 3 pages.
Office Action dated Jul. 6, 2012; for U.S. Appl. No. 12/706,318; 29 pages.
PCT International Preliminary Report on Patentability and Written Opinion of the ISA; dated Feb. 2, 2012; for PCT Patent Application No. PCT/US2010/042694; 11 sheets.
PCT International Preliminary Report on Patentability and Written Opinion of the ISA for PCT Pat. App. No. PCT/US2010/024256; dated Sep. 1, 2011; 9 pages.
PCT Search Report and Written Opinion of the ISA for PCT Pat. App. No. PCT/US2012/032315; dated Jun. 22, 2012; 18 pages.
PCT Search Report and Written Opinion of the ISA for PCT/US2010/042694 dated Sep. 27, 2010.
Sargent; "Switched-capacitor IC controls feedback loop;" EDN; Design Ideas; Feb. 17, 2000; pp. 154 and 156.
U.S. Notice of Allowance dated Dec. 10, 2012 for U.S. Appl. No. 12/706,318, 9 pages.
Wu, et al.; "A Chopper Current-Feedback Instrumentation Amplifier with a 1mHz 1/f Noise Corner and an AC-Coupled Ripple-Reduction Loop;" IEEE International Solid-State Circuits Conference; Feb. 10, 2009; pp. 322-324.
U.S. Appl. No. 12/840,324, filed Jul. 21, 2010, Juan Manuel Cesaretti, et al.
U.S. Appl. No. 12/793,163, filed Jun. 3, 2010, Foletto et al.
Office Action dated Sep. 11, 2012 from U.S. Appl. No. 12/840,324, 30 pages.
U.S. Response filed Dec. 11, 2012 to Office Action dated Sep. 11, 2012 for U.S. Appl. No. 12/840,324, 15 pages.
Final Office Action dated Feb. 12, 2013 for U.S. Appl. No. 12/840,324, 19 pages.
U.S. Appl. No. 13/095,371, filed Apr. 27, 2011, Juan Manuel Cesaretti, et al.
Invitation to Pay Additional Fees and, Where Applicable, Protest Fee, PCT/US2013/071648, date of mailing Apr. 3, 2014, 7 pages.
PCT Search Report of the ISA for PCT/US2013/071648 dated Jul. 23, 2014 9 pages.
PCT Written Opinion of the ISA for PCT/US2013/071648 dated Jul. 23, 2014 14 pages.
ACS710 "120 kHz Bandwidth, High Voltage Isolation Current Sensor with Integrated Overcurrent Detection", 2007, Allegro Microsystems Inc. 18 pages.
U.S. Appl. No. 14/507,024, filed Oct. 3, 2014, Petrie et al.
SAE International Surface Vehicle Information Report SAE J2716; SENT—Single Edge Nibble Transmission for Automotive Applications; Jan. 2010; 56 pages.
PCT/US2014/071825, Invitation to Pay Fees, date of mailing Jun. 10, 2015, 6 pages.
PCT International Preliminary Report on Patentability and Writing Opinion of the ISA dated Jul. 9, 2015; for PCT Pat. App. No. PCT/US2013/071648.
Notification of Transmittal of the International Search Report and the Written Opinion of the International Searching Authority, or the Declaration, PCT/US2014/071825, dated Oct. 8, 2015, 19 pages.
Final Office Action dated Dec. 4, 2015; For Pat. App. No. 13/730,100; 14 pages.
International Preliminary Report on Patentability, PCT/US2014/071825 date of issuance Jun. 28, 2016, 13 pages.
European Extended Search Report dated Jun. 29, 2017, for European Pat. App. No. 17158006.1; 7 pages.
Response filed Aug. 24, 2015; to Office Action dated Mar. 19, 2015; for U.S. Appl. No. 13/730,100; 16 pages.

\* cited by examiner

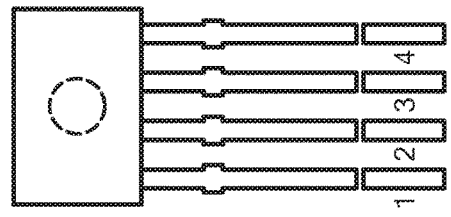
| Terminal List Table | | | | |
|---|---|---|---|---|
| Number | | Name | Function | |
| KT | LE | | | |
| 1 | 8 | VCC | Input power supply, use bypass capacitor to connect to ground; also used for programming | |
| 2 | 2 | VOUT | Output signal, also used for programming | |
| 3 | 3 | FAULT | Fault detection flag | |
| 4 | 1 | GND | Ground | |
| - | 4, 5, 6, 7 | NC | No Internal connection; connect to GND do not leave floating | |
*FIG. 12C*
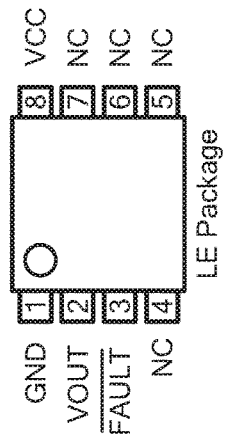
*FIG. 12B*
*FIG. 12A*

METHODS AND APPARATUS FOR SENSOR DIAGNOSTICS INCLUDING PROGRAMMABLE SELF-TEST SIGNALS

CROSS REFERENCE TO RELATED APPLICATIONS

The present application claims the benefit of U.S. Provisional Patent Application No. 61/920,827, filed on Dec. 26, 2013, which is incorporated herein by reference.

BACKGROUND

As known in the art, there are many safety critical applications for magnetic sensor integrated circuits (ICs). There are a variety of specifications directed to improving functional safety and achieving higher overall quality levels and lower field failure rates. For example, test modes for major functional parameters of an IC allow customers to implement test functionality prior to insertion on a printed circuit board, for example. However, after installation in a system or subsystem, such as an automobile, there are limited test opportunities to ensure that components are operating properly.

SUMMARY

In one aspect of the invention, an integrated circuit comprises: a magnetic sensing element having differential first and second outputs and an input, the input to receive current; first and second switches coupled to a respective one of the differential first and second outputs; a first voltage source coupled between the first and second switches, the first and second switches having a first state in which the first voltage source is coupled across the differential first and second outputs; and an IC output to output a voltage corresponding to the first voltage source when the first and second switches are in the first state for monitoring operation of a signal path from the magnetic sensing element to the IC output.

The integrated circuit can further include one or more of the following features: third and fourth switches coupled to a respective one of the differential first and second outputs; a second voltage source coupled between the third and fourth switches, the third and fourth switches having a second state in which the first voltage source is coupled across the differential first and second outputs, wherein the IC output outputs a voltage corresponding to the second voltage source when the third and fourth switches are in the second state for monitoring operation of a signal path from the magnetic sensing element to the IC output, the first and second voltage sources have different polarities, a fifth switch coupled between the second differential output of the magnetic field sensing element and the first switch, a sixth switch coupled between the first differential output of the magnetic field sensing element and the second switch, respective states of the first, second, third, and fourth switches is controllable to verify a gain of the signal path, the magnetic sensing element comprises a Hall element, the magnetic sensing element comprises a magnetoresitive element, an amplifier having respective inputs coupled to the first and second differential outputs of the magnetic sensing element, the integrated circuit comprises a linear magnetic sensor, a die supported by a leadframe having a region cutout from the leadframe, wherein the location of the magnetic sensing element is aligned with the region to reduce Eddy currents, the leadframe has corresponding leads having respective die attach portions, where a die is placed across the die attach portions of the leads, a voltage source to provide the current to the input of the magnetic sensing element, and/or a processor and a non-volatile memory to store instructions for the processor.

In another aspect of the invention, a method comprises: employing a magnetic sensing element having differential first and second outputs and an input, the input to receive current; coupling first and second switches to a respective one of the differential first and second outputs; coupling a first voltage source between the first and second switches, the first and second switches having a first state in which the first voltage source is coupled across the differential first and second outputs; and employing an IC output to output a voltage corresponding to the first voltage source when the first and second switches are in the first state for monitoring operation of a signal path from the magnetic sensing element to the IC output.

The method can further include one or more of the following features: coupling third and fourth switches to a respective one of the differential first and second outputs; coupling a second voltage source between the third and fourth switches, the third and fourth switches having a second state in which the first voltage source is coupled across the differential first and second outputs, wherein the IC output outputs a voltage corresponding to the second voltage source when the third and fourth switches are in the second state for monitoring operation of a signal path from the magnetic sensing element to the IC output, the first and second voltage sources have different polarities, coupling a fifth switch between the second differential output of the magnetic field sensing element and the first switch, coupling a sixth switch between the first differential output of the magnetic field sensing element and the second switch, respective states of the first, second, third, and fourth switches is controllable to verify a gain of the signal path, the magnetic sensing element comprises a Hall element, the magnetic sensing element comprises a magnetoresitive element, employing an amplifier having respective inputs coupled to the first and second differential outputs of the magnetic sensing element, the integrated circuit comprises a linear magnetic sensor, employing a die supported by a leadframe having a region cutout from the leadframe, wherein the location of the magnetic sensing element is aligned with the region to reduce Eddy currents, the leadframe has corresponding leads having respective die attach portions, where a die is placed across the die attach portions of the leads, a voltage source to provide the current to the input of the magnetic sensing element, and/or employing a processor and a non-volatile memory to store instructions for the processor.

In a further aspect of the invention, an integrated circuit comprises: a magnetic sensing element having differential first and second outputs and an input, the input to receive current; first and second switch means for coupling to a respective one of the differential first and second outputs; a first voltage source means coupled between the first and second switches, the first and second switches having a first state in which the first voltage source is coupled across the differential first and second outputs; and an IC output to output a voltage corresponding to the first voltage source means when the first and second switch means are in the first state for monitoring operation of a signal path from the magnetic sensing element to the IC output.

The integrated circuit can further include one or more of the following features: third and fourth switches coupled to a respective one of the differential first and second outputs;

a second voltage source coupled between the third and fourth switches, the third and fourth switches having a second state in which the first voltage source is coupled across the differential first and second outputs, wherein the IC output outputs a voltage corresponding to the second voltage source when the third and fourth switches are in the second state for monitoring operation of a signal path from the magnetic sensing element to the IC output, the first and second voltage sources have different polarities, a fifth switch coupled between the second differential output of the magnetic field sensing element and the first switch, a sixth switch coupled between the first differential output of the magnetic field sensing element and the second switch, respective states of the first, second, third, and fourth switches is controllable to verify a gain of the signal path, the magnetic sensing element comprises a Hall element, the magnetic sensing element comprises a magnetoresitive element, an amplifier having respective inputs coupled to the first and second differential outputs of the magnetic sensing element, the integrated circuit comprises a linear magnetic sensor, a die supported by a leadframe having a region cutout from the leadframe, wherein the location of the magnetic sensing element is aligned with the region to reduce Eddy currents, the leadframe has corresponding leads having respective die attach portions, where a die is placed across the die attach portions of the leads, a voltage source to provide the current to the input of the magnetic sensing element, and/or a processor and a non-volatile memory to store instructions for the processor.

In another aspect of the invention, an integrated circuit comprises: a drive current source; a magnetic sensing element coupled to the drive current source, the magnetic sensing element having first and second differential outputs; first and second current elements to provide respective currents in relation to the drive current source, wherein the first current element is coupled to the first differential output and the second current element is coupled to the second differential output; and an IC output to output a voltage corresponding to the currents of the first and second current elements.

The integrated circuit can further include one or more of the following features: the first current element comprises a current replicator, the first and second current elements comprise respective current replicators, the first and second current elements provide a respective current in proportion to the drive current source, the magnetic sensing element comprises a Hall element, the magnetic sensing element comprises a magnetoresistive element, a signal path that includes a voltage divider having a first resistive element, a second resistive element, and third resistive element, wherein the second resistive element comprises the magnetic sensing element, and/or the integrated circuit provides an output voltage on the IC output that is proportional to an applied magnetic field.

In another aspect of the invention, a method comprises: employing a drive current source; coupling a magnetic sensing element to the drive current source, the magnetic sensing element having first and second differential outputs; employing first and second current elements to provide respective currents in relation to the drive current source, wherein the first current element is coupled to the first differential output and the second current element is coupled to the second differential output; and providing an IC output to output a voltage corresponding to the currents of the first and second current elements.

The method can further include one or more of the following features: the first current element comprises a current replicator, the first and second current elements comprise respective current replicators, the first and second current elements provide a respective current in proportion to the drive current source, the magnetic sensing element comprises a Hall element, the magnetic sensing element comprises a magnetoresistive element, a signal path that includes a voltage divider having a first resistive element, a second resistive element, and third resistive element, wherein the second resistive element comprises the magnetic sensing element, and/or the integrated circuit provides an output voltage on the IC output that is proportional to an applied magnetic field.

In another aspect of the invention, an integrated circuit comprises: a magnetic sensing element; a coil disposed in proximity to the magnetic sensing element; a self test module coupled to ends of the coil to exercise an analog signal path including from the magnetic sensing element to the IC output.

The integrated circuit can further include one or more of the following features: the IC output outputs a voltage that is proportional to an applied magnetic field, the magnetic sensing element comprises a Hall element disposed on a silicon substrate common to the integrated circuit, the magnetic sensing element comprises a magnetoresistive element disposed on a silicon substrate common to the integrated circuit, the magnetic sensing element comprises a Hall element, the self test module includes a first current source coupled to one of the coil and a second current source coupled to the other end of the coil, the integrated circuit comprises a linear current sensor, integrated circuit comprises a switch, a die supported by a leadframe having a region cutout from the leadframe, wherein the location of the magnetic sensing element is aligned with the region to reduce Eddy currents, and/or the magnetic sensing element comprises a Hall element.

In a further aspect of the invention, a method comprises: locating a coil in proximity to a magnetic sensing element forming a part of an integrated circuit; coupling a self test module to ends of the coil to exercise an analog signal path including from the magnetic sensing element to the IC output; and exercising the analog signal path from the magnetic sensing element to the IC output.

The method can further include one or more of the following features: coupling a first current source of the self test module to one end of the coil and a second current source of the self test module to the other end of the coil, applying controlling the first and second current sources to verify operation of the integrated circuit, including comparator switchpoints, controlling the first and second current sources to verify operation of the integrated circuit, including deflecting the IC output in proportion to current in the coil, applying a constant current to the coil and verifying a deflection on the IC output proportional to a gain of the analog signal path, verifying a zero field operation of the IC output, and/or employing a die supported by a leadframe having a region cutout from the leadframe, wherein the location of the magnetic sensing element is aligned with the region to reduce Eddy currents.

In a further aspect of the invention, an integrated circuit comprises: a magnetic sensing element; fault detection module coupled to the sensing element, the fault detection module including circuitry to detect a fault condition and to self-test operation of the circuitry for detecting the fault condition; and a fault pin to indicate the fault condition.

The integrated circuit can further include one or more of the following features: the fault detection module includes a window comparator having at least one threshold associated with the fault condition, the at least one threshold corresponds to a short circuit condition, the short circuit condition is located in a signal path extending from the window comparator to the magnetic sensing element, the fault pin is activated to a given state upon fault detection by the at least one threshold, and/or self-test signals of the self-test operation are programmable in duration.

In another aspect of the invention, a method comprises: coupling a magnetic sensing element to fault detection module in an integrated circuit; providing the fault detection module to include circuitry to detect a fault condition and to self-test operation of the circuitry for detecting the fault condition; providing self-test signals; and providing a fault pin to indicate the fault condition.

The method can include one or more of the following features: the fault detection module includes a window comparator having at least one threshold associated with the fault condition, the at least one threshold corresponds to a short circuit condition, the short circuit condition is located in a signal path extending from the window comparator to the magnetic sensing element, the fault pin is activated to a given state upon fault detection by the at least one threshold, the fault condition includes a current level above a threshold, the fault pin is an input/output pin such that pulling the fault pin to a given voltage level for a given time provides a self-test request to initiate the self-test operation, the given time of the self-test request is programmable, the given time of the self-test request corresponds to power up initiation of self-test request, the self-test operation is entered only when an applied magnetic field is below a magnetic field threshold, controlling a voltage on the fault pin to provide an acknowledge signal indicating entrance into the self-test operation, an amount of time the acknowledge signal is active is programmable, controlling the voltage level on the fault pin to provide results from the self-test operation, timing the voltage level on the fault pin to indicate a pass or a fail of the self-test operation, a transition of the voltage level at a first time indicates pass, a transition of the voltage level at a second indicates a sensor test fail, and a transition of the voltage level at a third time indicates a fault failure, the first, second, and third times are programmable, initiating the self-test operation after a temperature change of greater than a temperature threshold, the integrated circuit comprises a package having exactly four pins, employing a die supported by a leadframe having a region cutout from the leadframe, wherein the location of the magnetic sensing element is aligned with the region to reduce Eddy currents, the self-test is terminated when a magnetic field above a flux threshold is detected, the integrated circuit comprises a linear current sensor, and/or, self-test signals of the self-test operation are programmable in duration.

BRIEF DESCRIPTION OF THE DRAWINGS

The foregoing features of this invention, as well as the invention itself, may be more fully understood from the following description of the drawings in which:

FIG. 12A is a top view of a sensor in a KT package;

FIG. 12B is a top view of a sensor in a LE package;

FIG. 12C is a tabular representation of an exemplary terminal listing;

DETAILED DESCRIPTION

Figure 1:
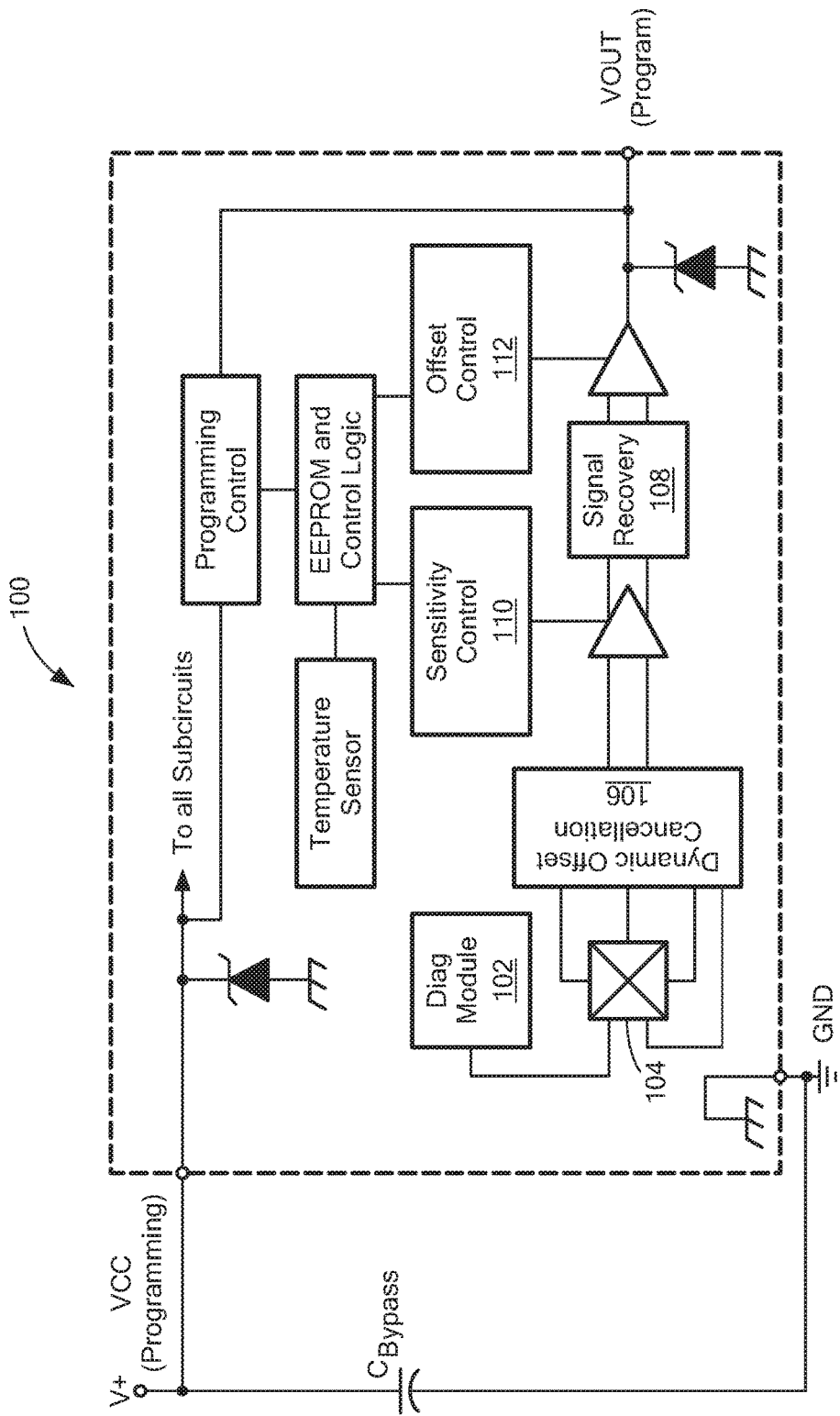
FIG. 1 is a schematic representation of a sensor having a signal path diagnostics in accordance with exemplary embodiments of the invention.

FIG. 1 shows an exemplary embodiment of a linear magnetic sensor IC 100 having a signal path diagnostic module 102 in accordance with exemplary embodiments of the invention. In one embodiment, the sensor IC 100 comprises a current sensor linear device with a 120 KHz bandwidth, for example. The sensor IC has an analog output voltage VOUT that is proportional to an applied magnetic field. In one embodiment, the sensor has a linear output that starts at Vcc/2 and swings in positive and negative directions depending on the polarity of the applied field.

The sensor IC senses current in a manner well known in the art. In general, a magnetic field sensing element, such as a Hall element 104, generates a voltage in response to an applied magnetic field. A dynamic offset cancellation module 106 'chops' the signal and a signal recovery module 108 provides an output signal. Sensitivity control 110 and offset control 112 can be used to adjust the signals, as shown and described for example, in U.S. Pat. No. 7,923,996, and U.S. Patent Publication No. US2011/0018533, which are incorporated herein by reference. It is understood that other techniques can be used to meet the needs of a particular application.

The magnetic field sensing element 104 in this and other embodiments can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, a magnetic tunnel junction (MTJ), a spin-valve, etc. The sensing element 104 may include a single element or, alternatively, may include two or more elements arranged in various configurations, e.g., a half bridge or full (Wheatstone) bridge. Depending on the device type and other application requirements, the sensing element 104 may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet, and a magnetic field sensor that senses a magnetic field density of a magnetic field.

Exemplary embodiments of the invention are applicable to a variety of sensing applications having a range of sensing elements. Exemplary sensors include magnetic field, accelerometer, temperature, gyroscope, pressure, chemical, biological, strain, piezoelectric, etc. Exemplary embodiments of the invention are applicable to a wide range of applications in which sensing magnetic fields generated by moving magnets or flowing current are desirable. For example, exemplary embodiments of the invention are useful for HEV (hybrid electric vehicle) inverter applications because it has a 120 KHz operating bandwidth that allows the sensor to be used in the gap of a core to sense the inverter phase current.

Exemplary embodiments of the invention provide an enhanced Safety Integrity Level (SIL) as compared to conventional magnetic field sensors. As described more fully below, diagnostics can identify faults in the signal path by driving a current across the sensing element. While reference is made to a Hall element, as noted above, it is understood that any practical type of sensing element can be used. While exemplary embodiments are shown and described in conjunction with Automotive Safety Integrity Level (ASIL) testing, it is understood that the scope of the invention is not limited to ASIL in any way.

Figure 2:
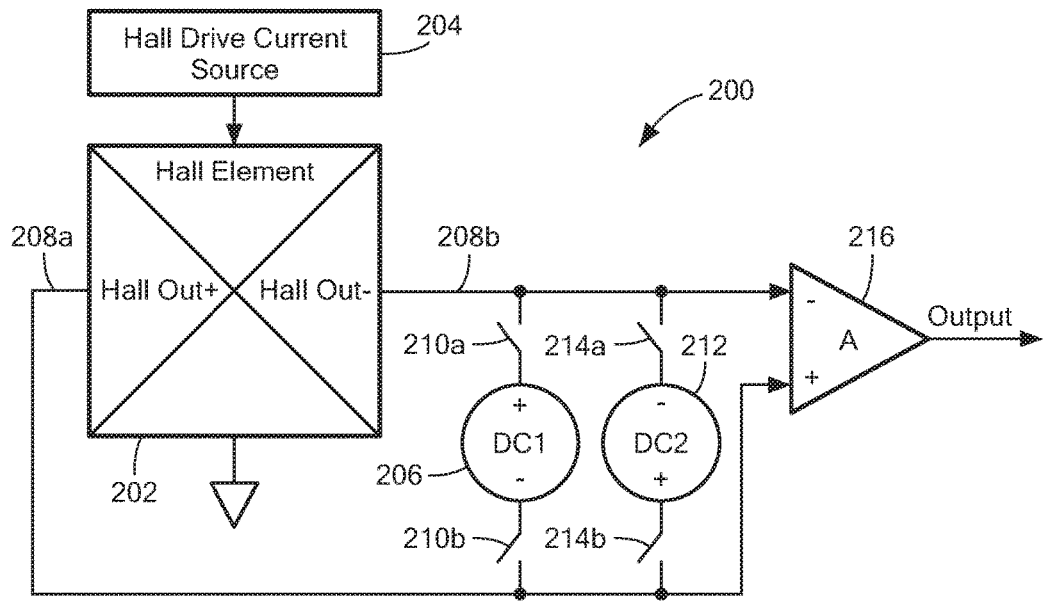
FIGS. 2 and 2A are schematic representations of a portion of a sensor with a voltage applied to a sensing element.

FIG. 2 shows a portion of an exemplary magnetic field sensor 200 having a voltage applied to a differential sensing element 202, shown as a Hall element. A current source 204 is coupled to the sensing element 202 for applying current to the element, e.g., biasing the Hall element. A first voltage source 206 is coupled between the differential outputs 208a,b of the Hall element 202. In one embodiment, first and second switches 210a,b selectively control whether the first voltage source 206 is coupled to one or both of the differential outputs 208a,b of the Hall element. An optional second voltage source 212 can be coupled between the differential Hall outputs via third and fourth switches 214a, b. In one embodiment, the first and second voltages sources 206, 212 have opposite polarity.

When the first and second switches 210a,b are closed, a positive voltage, shown as DC1, is applied to the signal path causing a negative voltage to appear on the output of the amplifier 216. When the first and second switches are open, and the third and fourth switches 214a,b are closed, then a negative voltage, shown as DC2, is applied to the Hall element outputs 208 causing a positive voltage on the amplifier 216 output. If the magnitude of the voltages of the first and second sources 206, 212 are well controlled, then the gain of the signal path can be verified since the output voltage will be proportional to the input stimulus voltages DC1 and DC2.

Alternatively if the input stimulus voltages of DC1 and/or DC2 are larger than a certain threshold voltage, the amplifier 216 output will saturate. It is understood that a saturated output allows the user to verify the connectivity and the basic functionality of the signal path without providing information regarding the signal path gain.

Figure 2A:
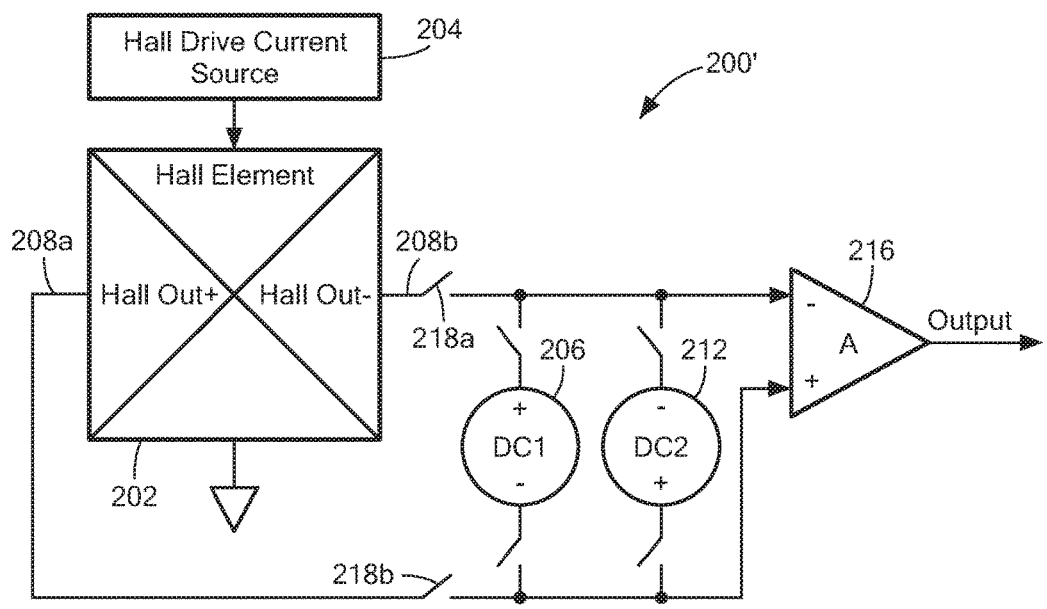

FIG. 2A shows the addition of fifth and sixth switches 218a,b to the sensor of FIG. 2 for isolating the Hall Plate from the signal path during ASIL testing, for example, to minimize any interference between the applied stimulus voltage and any voltage developed across the Hall element. In one embodiment, DC1 corresponds to the supply voltage and DC2 corresponds to GND.

In another aspect of the invention, a sensor having a magnetic sensing element includes signal injection into the sensing element. One consideration with the presence of an excitation coil to exercise a magnetic sensing element is the current draw when exciting the coil. The coil, which can be created on the metal layers of a silicon Hall integrated circuit, for example, determines the magnitude of the magnetic field that can be generated from a given current. In one embodiment, the generated magnetic field is limited to about 20 Gauss, which limits the output deflection.

Figure 3:
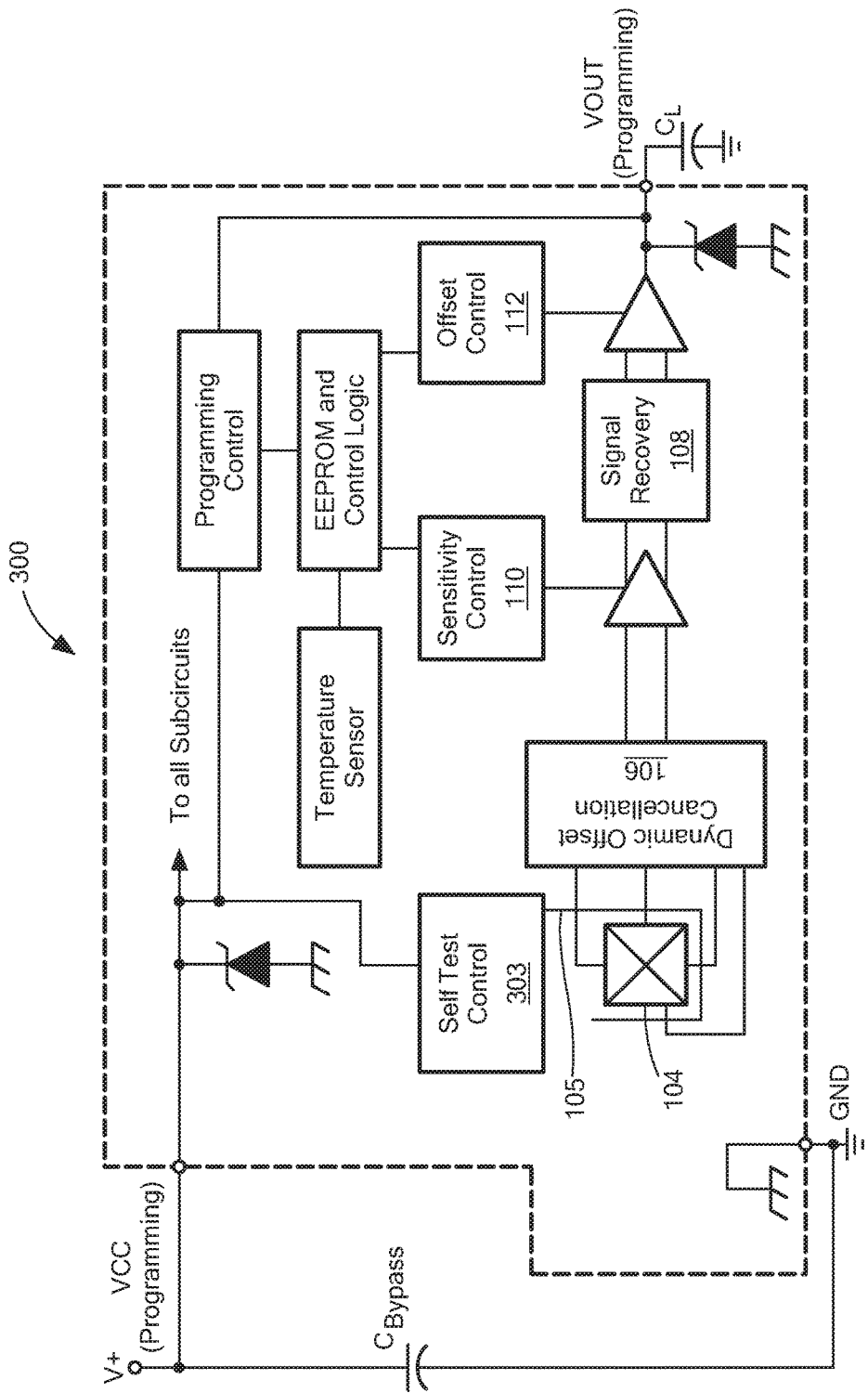
FIG. 3 is a schematic representation of a sensor having self-test functionality.

FIG. 3 shows a sensor 300 having commonality with the sensor 100 of FIG. 1. The sensor 300 has an analog output voltage that is proportional to an applied magnetic field. In one embodiment, a linear output VOUT starts at Vcc/2 and swings in the positive and negative direction depending on the polarity of the applied field. A self-test control module 303 is coupled to the sensing element 104 to provide self-test functionality. In safety critical applications, for example, the end user is interested in improving the Safety Integrity Level (SIL) of the sensor. Self-test diagnostics achieve added integrity. As described below, exemplary embodiments of the invention provide stimulation of the analog signal path to provide self-testing diagnostics. Diagnostic results can be communicated to the end user.

It should be noted that for the sequence of events of the self-test diagnostic functionality, the times for acknowledging the fault or presenting the results of the self diagnostics to the end user should be programmable. Programming allows for multiple operating platforms that may require different delay times for initiating, acknowledging and reporting self-test events.

Figure 3A:
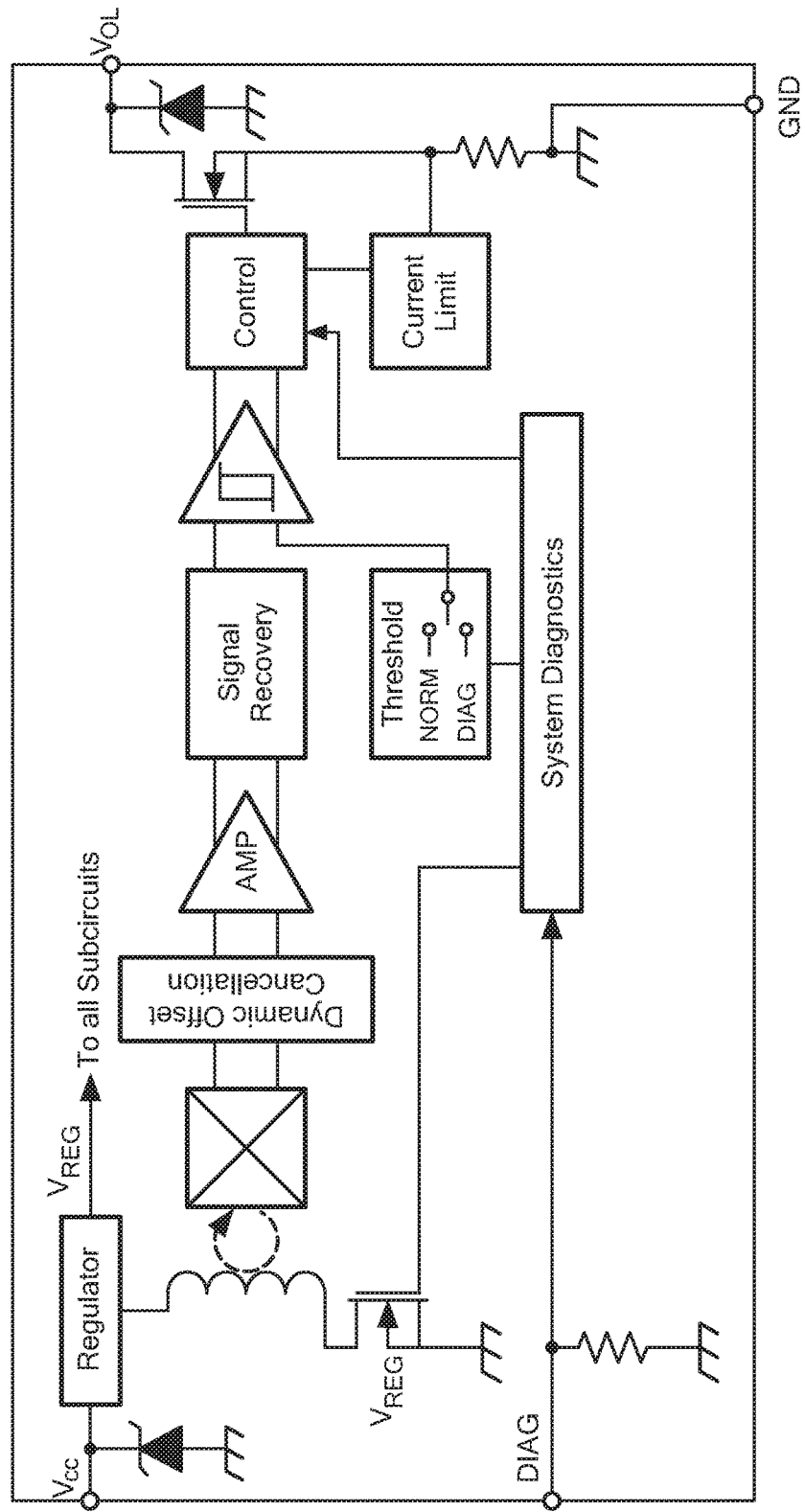
FIG. 3A is a schematic representation of a switch having diagnostic functionality.

As noted above, testing stimulates the analog signal path in a number of ways. In one embodiment, a coil 105 is placed around or near a Hall element (or magnetic field sensing element) on the silicon substrate, for example, and control current passed through the coil, as shown in FIG. 3. The Hall transducer 104 is stimulated at the front end when current flows through the coil 105 by generating a magnetic field in order to test the analog signal path. In one embodiment, a coil is used to test functionality of a diagnostic switch, such as the switch shown in FIG. 3A. Current is switched on and off in the coil and switchpoints of the comparator are adjusted such that during self-test the device output has a 50% PWM signal on the output. If the device fails diagnostic testing, the output is stuck in the high or low state during the testing period.

Figure 3B:
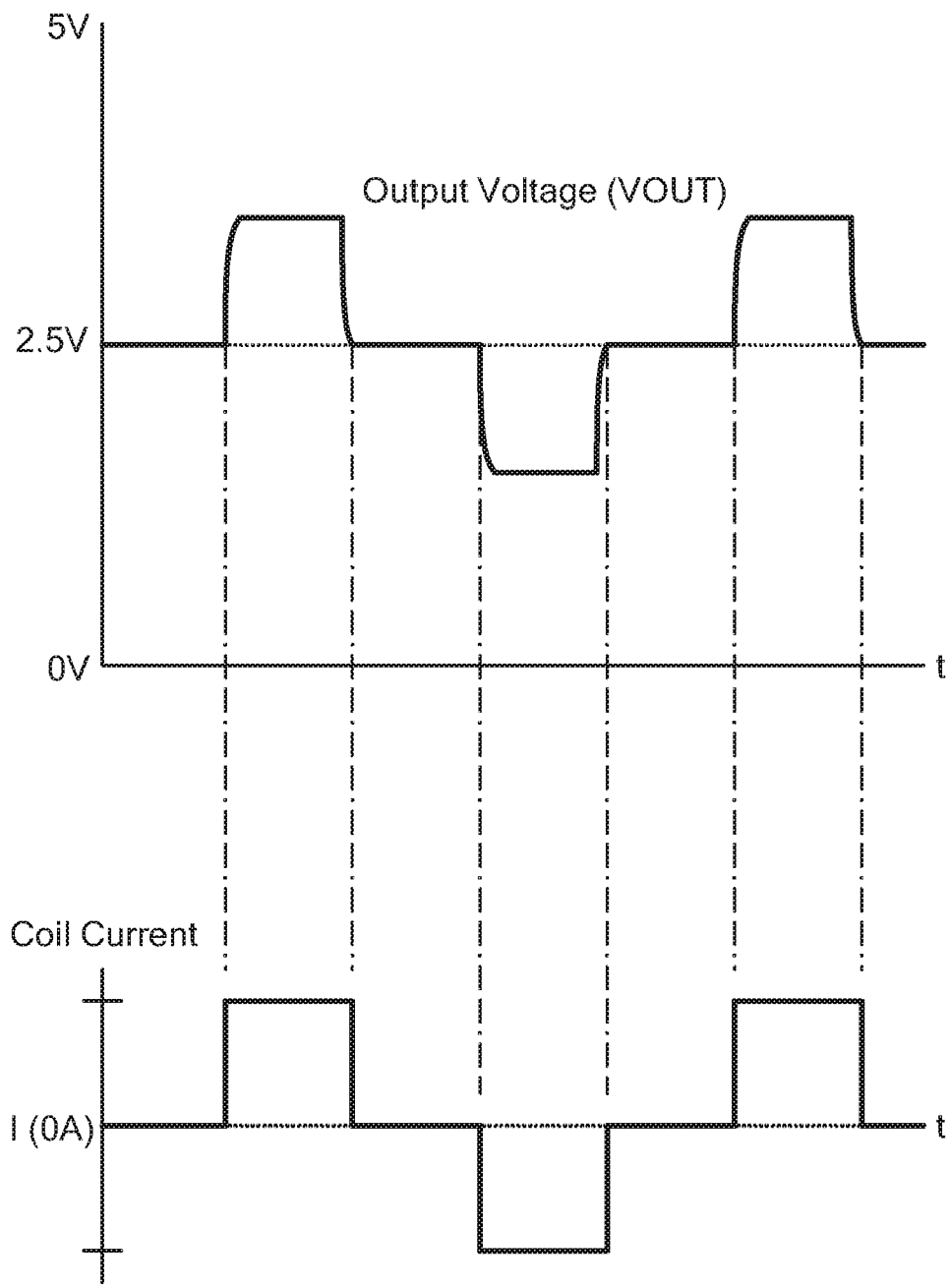
FIG. 3B is graphical representation of an output signal corresponding to current through a coil.

Referring again to FIG. 3, in an exemplary embodiment self-diagnostic testing includes coupling a current source to both ends of the coil 105 so current can flow in either direction to create either a positive and negative magnetic test field in the sensing element 104. During self-test, the coil 105 generates a magnetic field that can deflect the output of the analog signal proportional to the current flowing in the coil 105, as shown in FIG. 3B. The stimulation passes directly through the entire analog signal path to the output VOUT.

This arrangement provides a number of advantages. The analog signal path programmed sensitivity can be checked by the end user. By applying a constant current through the coil, the magnetic field generated by the coil will be fixed. This fixed magnetic field causes a deflection on the output of the analog output proportional to the gain of the analog signal path. Since the gain of the device is programmable and the design of the coil is well understood, both are well known quantities and can provide the basis for an accurate measurement of the analog signal path by the end user.

In addition, none of the analog signal path is modified during testing. In the diagnostic switch of FIG. 3A, the switchpoints for diagnostics and for normal operation are different. If the gain or comparator thresholds of the sensor during normal operation were to fail, it is possible under certain conditions that the device self-diagnostic could trigger properly but the normal operating mode could have magnetic switchpoints that were out of specification. Attention in the design of the sensor can minimize, but perhaps not eliminate, the window that can cause a false positive test.

Further, the offset of the device can also be tested. Since the zero gauss field analog output voltage is also programmed, the zero field output signal, as well as the signal path gain, can be self-tested with a relatively high level of accuracy. If it were to drift for some reason, it could be identified during the self-test.

Reporting of the test results can be accomplished in several ways. In one embodiment, deflection of the analog signal is monitored by the user. In another embodiment, PWM is used to generate a PWM output signal. Test results can be reported on a separate pin or through some voltage modulation on another pin or current modulation. In a two-wire sensor, current modulation can be used to communicate data.

Figure 4:
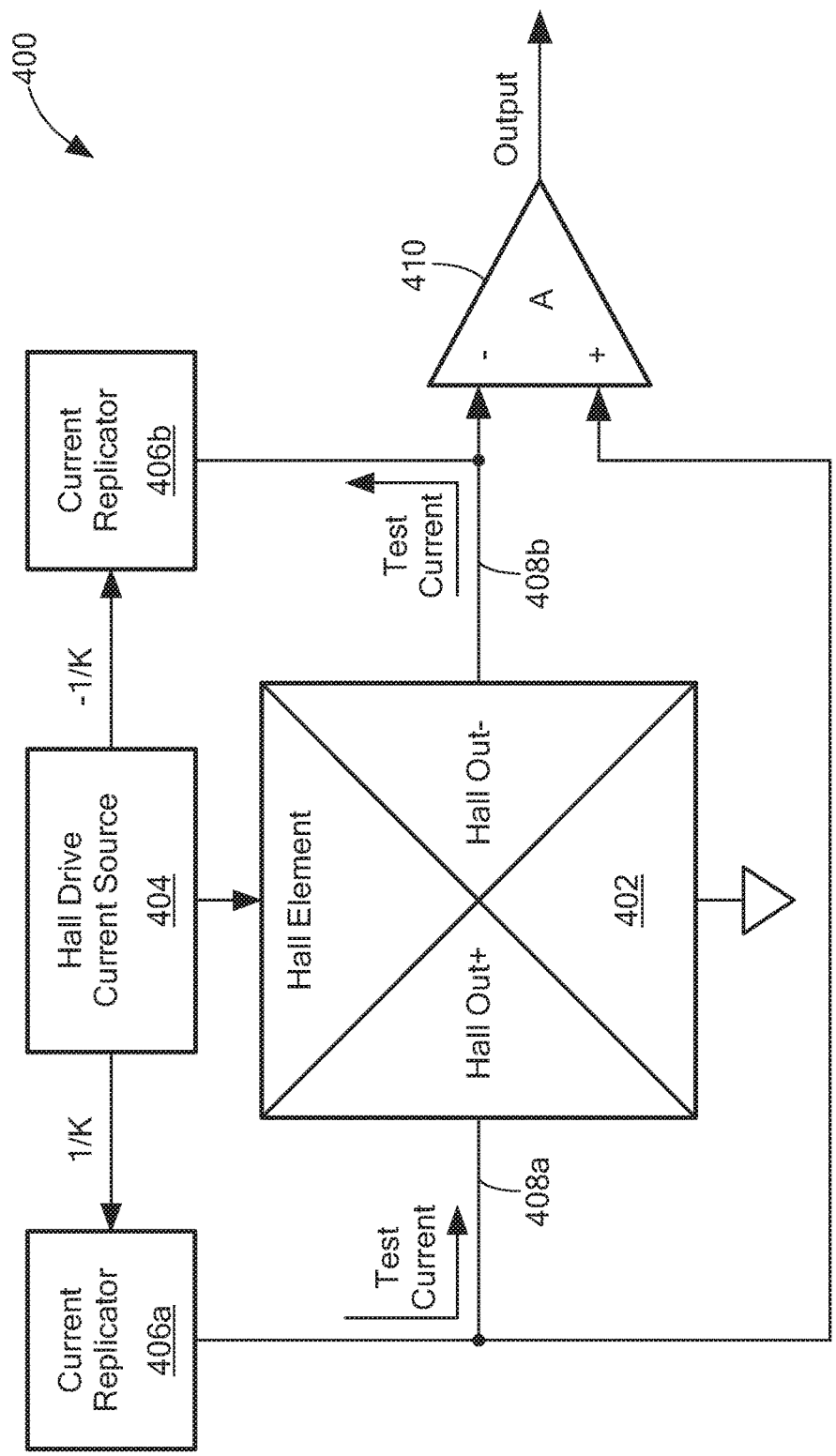
FIG. 4 is a schematic representation of a portion of a sensor having a current applied across a sensing element.

FIG. 4 shows a portion of a sensor 400 having a magnetic sensing element 402, shown as a Hall element, to which an electrical signal is applied. While the response of the Hall plate may not be verified, the remainder of the signal path to the sensor output can be tested.

A current source 404 is coupled to the Hall element 402 for providing a bias current, and to first and second current replicators 406*a,b*. The first current replicator 406*a* provides a current to a first differential output 408*a* of the Hall element 402 and the second current replicator 406*b* receives a current from the second differential output 408*b* of the Hall element. The differential outputs 408*a,b* of the Hall element are coupled to an amplifier 410. In an exemplary embodiment, the first and second current replicators 406 provide a current in proportion to the current generated by the current source 404, as determined by a constant K.

In applying currents to the Hall element 402, a voltage is created across the hall plate output since the hall plate is a resistive element. The current establishes a differential output signal across the differential Hall element outputs 408.

In an alternative embodiment, independent current sources are coupled to the Hall plate output terminals. In other embodiments, voltage signals are applied to the Hall element.

Figure 4A:
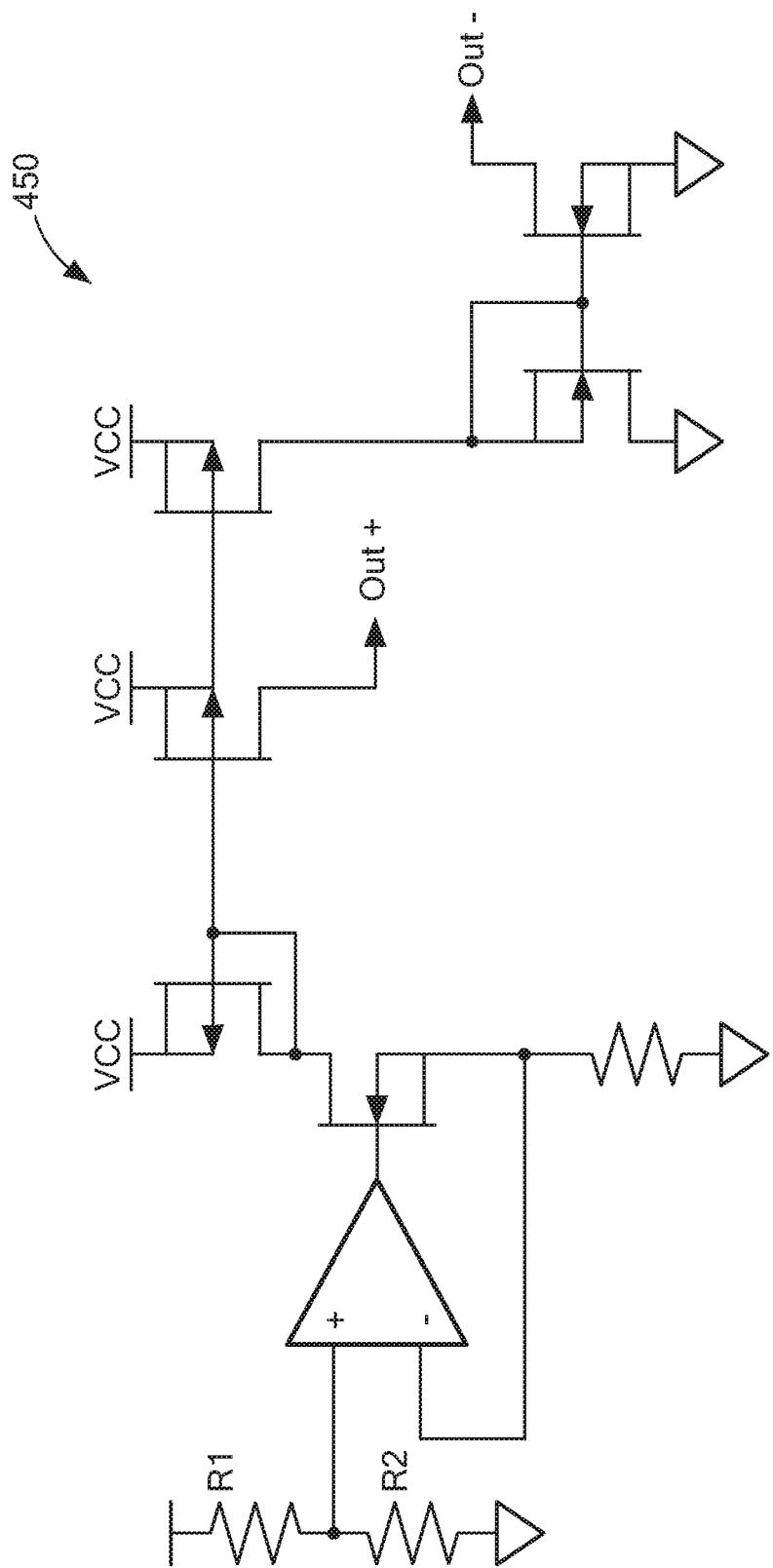
FIG. 4A is a circuit diagram of an exemplary test circuit.

FIG. 4A shows an exemplary embodiment of a test circuit 450 that creates a differential reference signal Out+, Out− that can be applied to the Hall plate output ports 408*a,b* (FIG. 4). In the illustrated embodiment, a voltage divider R1, R2 provides a current proportional to the voltage coupled to the divider. The current is proportional to the supply voltage coupled to the divider. In an alternative embodiment, a differential current reference circuit can produce a current that is absolute in value. If the sensor is designed to be ratio-metric to the power supply voltage, then the power supply voltage can be used as the external signal. If the circuit output is absolute, rather than ratio-metric, an absolute differential current circuit should be used. It is understood that replacing the resistor divider R1/R2 with a bandgap voltage reference converts this circuit from a proportional output to an absolute output.

In one embodiment, the test circuit 450 can replace the current replicator circuits 406*a,b* in FIG. 4. An additional mechanism can be added to verify the function of the Hall drive current source. For example, the voltage across the inputs terminals of the hall plate can be measured and compared to an expected level. An indication signal from a circuit that verifies that the correct input current is applied to the hall plate is used to enable the test current generation circuit, e.g., test circuit 450. In this way, if the hall plate is improperly driven, the test circuit will not provide a test stimulation signal to the hall plate and the output will then reflect a circuit failure through an improper output deflection from the nominal level during test. It is understood that the output signals Out+, Out−, can be coupled to switches, such as those found in the dynamic cancellation block (FIG. 1).

Figure 4B:
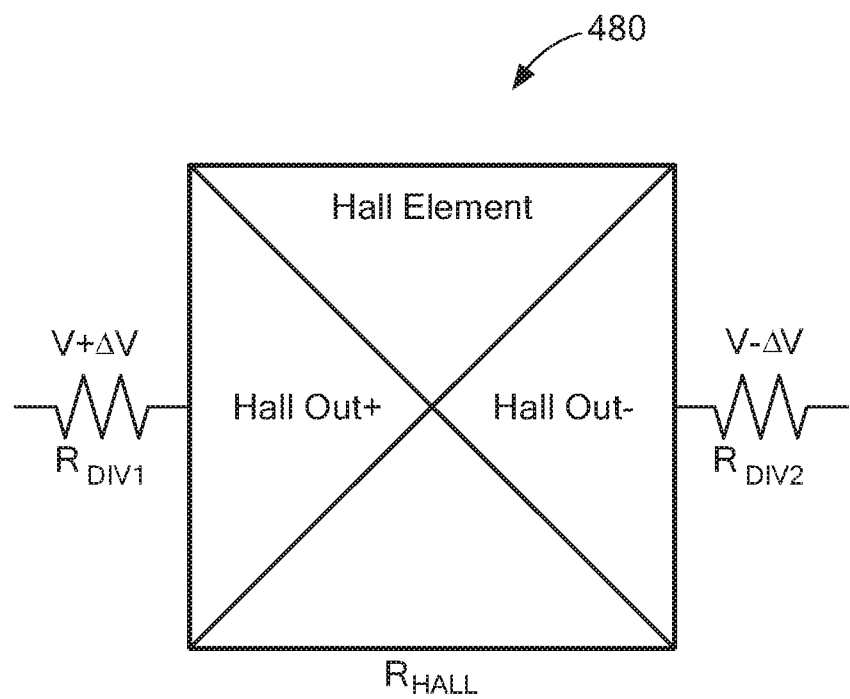
FIG. 4B is a schematic representation of a reference voltage applied across a series of resistors including a Hall element.

FIG. 4B shows an exemplary circuit 480 applying a reference voltage across a voltage divider comprised of first, second, and third resistors $R_{DIV1}$, $R_{HALL}$, $R_{DIV2}$ in series, where the middle (second) of these three resistors is the hall plate itself. First and second signals V+ΔV, V−ΔV are applied, one to the free end of the first resistor $R_{DIV1}$ and the other to the free end of the third resistor with the second resistor (the hall plate) connected between the remaining ends of the first and third resistors $R_{DIV1}$, $R_{DIV2}$.

The Hall plate between the two resistors can be expanded to allow for coarse signal level adjustments by locating the Hall plate between two series strings of resistors with various (symmetric) tap points into the resistor strings. Applying V+(deltaV) and V−(deltaV) to a tap points closer to the Hall element provides a larger signal across the Hall element.

In the illustrated embodiment, the voltage appearing across the hall plate between Hall Out+ and Hall Out− is given in the equation:

$$(V_{HALL\ OUT+} - V_{HALL\ OUT-}) = \Delta V \cdot \frac{R_{HALL}}{R_{HALL} + 2 \cdot R_{DIV}}$$

A supplemental circuit can be used to ensure that the Hall driver circuit is functioning properly. In this case the output of the supplemental circuit can be used to control switches that are used to connect the two test resistors to the signals V+ΔV and V−ΔV. In this way, if it is determined that the Hall plate driver circuit is not functioning properly, then the test signal is not applied to the hall plate and no deflection will be observed at the output of the signal path.

Figure 5:
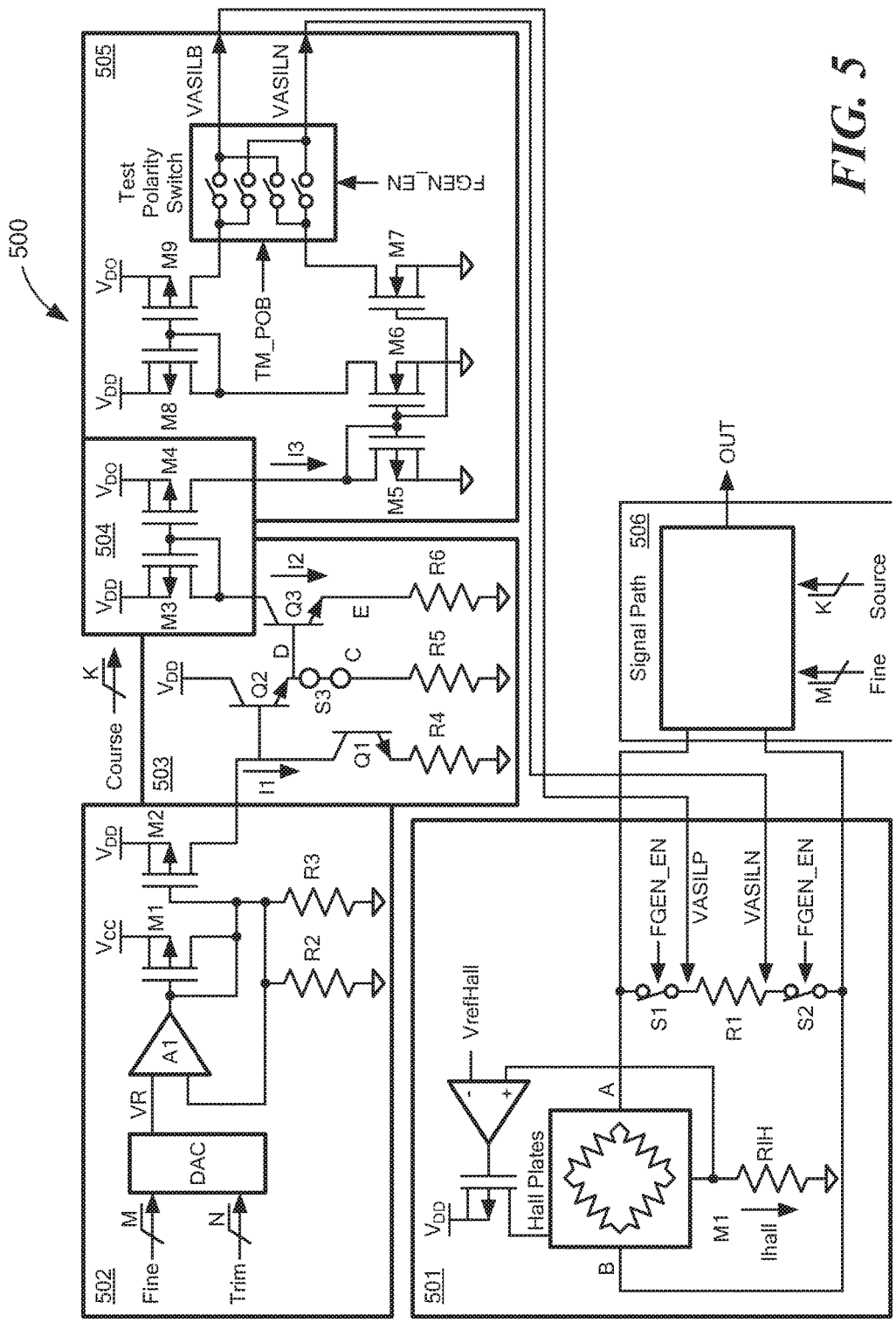
FIG. 5 is a circuit diagram of an exemplary circuit to generate a test mode signal.

FIG. 5 shows an exemplary circuit 500 to generate a test mode signal at the input to the signal path of the hall detection device. The circuit 500 generates an output signal OUT which is a fixed value. In one embodiment, this value is bi-directional so that one can test the circuits for input fields generated in either polarity. A first circuit block 501 includes a resistor R1 shorted across the Hall device effective resistance between nodes A and B through first and second switches S1, S2 during test mode. The current generated in circuit blocks 502-505 is applied to the first resistor R1 at nodes VASILP and VASILN during the test mode. The voltage generated across nodes A and B is then presented as the input to signal processing block 506. The output OUT is a constant magnitude with a polarity defined by signal TM_POS through the selection of the polarity switch.

In circuit block 502, the amplifier A1 forces a voltage VR across two parallel resistors R2 and R3. These resistors are scaled versions of R1 and the effective resistance Hall device resistance between nodes A and B. This results in a first order correction for global process variation and temperature of operation. The input VR to the amplifier A1 is determined by the values of Fine, which compensated for variations in the Fine gain setting in the signal path in circuit block 405, and the value of Trim which allows for some trimming of more local processing errors, such as device matching in the current generating circuits (block 502-505) and the parallel shorting resistor R1.

Errors due to the resistance in switches S1 and S2 in circuit block 501 are compensated for in circuit block 503. The current I1 generated in circuit block 502 flows through Q1 and resistor R4. The voltage at the base of device Q1 (Node C) is VC=I1*R4+Vbe 1. The current through R5 and the switch S3, supplied by Q2 is then IR5=(I1*R4+Vbe 1)/R5. The voltage at the base node of Q3 (node D) is VD=IR5*(R5+Rs3), where Rs3 is the on resistance of switch S3. The voltage across R6 (voltage at node E) is VE=Vd−Vbe3, and therefore I2=VE/R6. Through proper scaling of devices, the ratio I2/I1 can be made to compensate for the voltage dropped across the switches S1 and S2 in circuit block 501.

Circuit block 504, which is shown as a current mirror, can be made programmable with a coarse gain setting so current ratio I3/I2 adjusts the voltage across R1 to maintain a constant voltage OUT independent of coarse gain setting.

A differential current is generated in circuit block 505 which provides a chopping switch needed to change polarity of the output signal OUT which also allows for the current to be disconnected when not in test mode.

In another aspect of the invention, self-test diagnostics improve functional safely levels in safety critical applications using self-test initiation, such as at power up or by user control. In exemplary embodiments, timing of self-test signals is adjusted to align with expected signal timing. Initiating self-test functionality relates to overall system control of the sensor system. Flexibility in signal generation enables different users to improve safety levels in a variety of ways. For example, the level of safety required in a given system dictates how often self-diagnostics should report its operating or error condition to a user.

Figure 6:
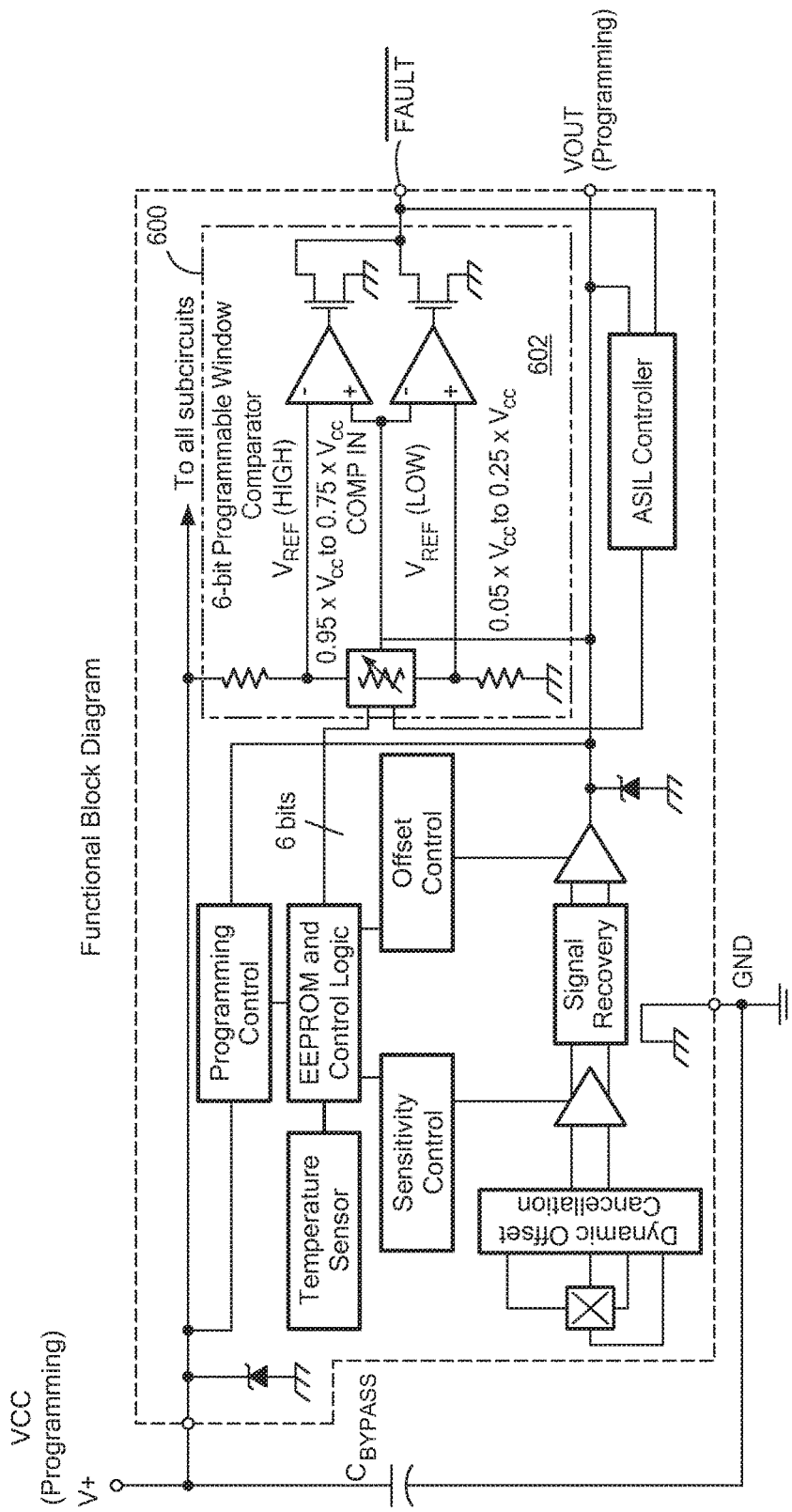
FIG. 6 is a schematic representation of an exemplary sensor having fault detection.

FIG. 6 shows further detail of an exemplary embodiment of a fault detection module 600 for monitoring the analog output and includes a programmable window comparator module 602 with comparators to generate the fault output FAULT. In one embodiment, the fault detection module 600 detects a fault and activates the fault output FAULT. It is understood that the fault output FAULT can be readily set to the active state for either a positive (logical ONE) or negative (logical ZERO). In the illustrated embodiment, the fault output is shown as active low.

It is understood that the fault output FAULT can provide redundancy with other fault signals in the system, such as from a motor driver or micro-controller. This redundancy improves the overall control system functionality, such as the Automotive Safety Integrity Level (ASIL) applicable to safety levels in safety critical applications in automobiles. For example, power steering and accelerator pedal position require higher levels of safety defined by ASIL.

In an exemplary embodiment, the fault detection module includes a self-test routine that can be initiated by the user to ensure that the sensor fault function is operating properly. In one embodiment, self-test is initiated by providing a given voltage level on the FAULT pin.

Figure 6A:
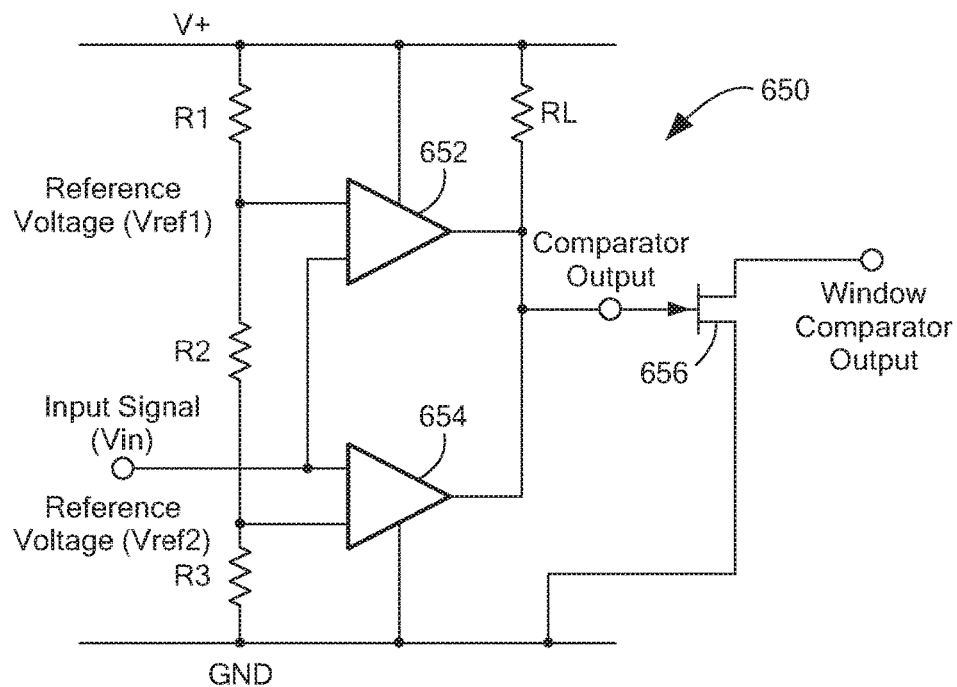
FIG. 6A is a circuit diagram of an exemplary comparator circuit.

FIG. 6A shows an exemplary window comparator 650 that can form a part of the fault detection module of FIG. 6. Resistors R1, R2, and R3 determine trip points of first and second comparators 652, 654. In an exemplary embodiment, a reference voltage resistor can be programmable by employing R/2R ladder DACs, which are well known in the art, to set the desired window thresholds for detecting the fault. The circuit can be programmed to trip under a short condition and the fault output FAULT becomes active when a short circuit current, for example, is detected by the comparators.

In one embodiment, the fault can be detected as a positive or negative value using the respective comparators 652, 654. In the illustrated embodiment, the comparator output is configured for active low operation. If the first or second comparators 652, 654 have an active output, a switch 656 is activated to bring the fault output FAULT to ground.

Figure 7:
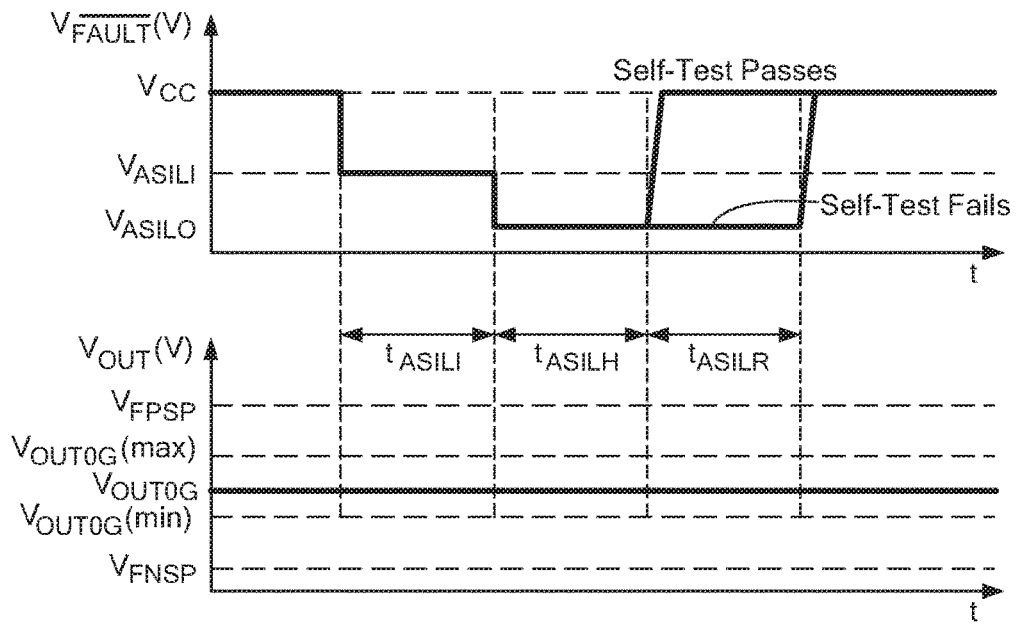
FIG. 7 is a timing diagram showing fault signal voltage and output voltage over time.

In one embodiment, the fault pin FAULT comprises an input/output pin that enables initialization of the self-test function, as shown in FIG. 7. During a time when the magnetic field is near zero, meaning no current flows in the application, and therefore no magnetic field, the FAULT output pin can be pulled to Vcc/2 to initiate self-test of the fault detection functionality. In the illustrated embodiment, during time $t_{ASILI}$ the voltage on the FAULT pin is pulled Vcc/2, shown as $V_{ASILI}$. During time $t_{ASILH}$, self-test is performed. The device pulls the FAULT pin output low during this time to acknowledge the device received the command to initiate self-test during time tASILI During time $t_{ASILR}$, the results of the self-test are output on the FAULT pin, shown as Vcc for a self-test pass and $V_{ASILO}$ for self-test fail.

As noted above, and shown in FIG. 7, the output voltage Vout will be at $V_{OUTOG}$ when no magnetic field is present. During normal operation, the output voltage Vout can vary from a maximum $V_{OUTG(max)}$ and a minimum of $V_{OUTG(min)}$. VFPSP and VFNSP refer to the positive full scale output voltage and negative full scale output voltage.

Figure 8:
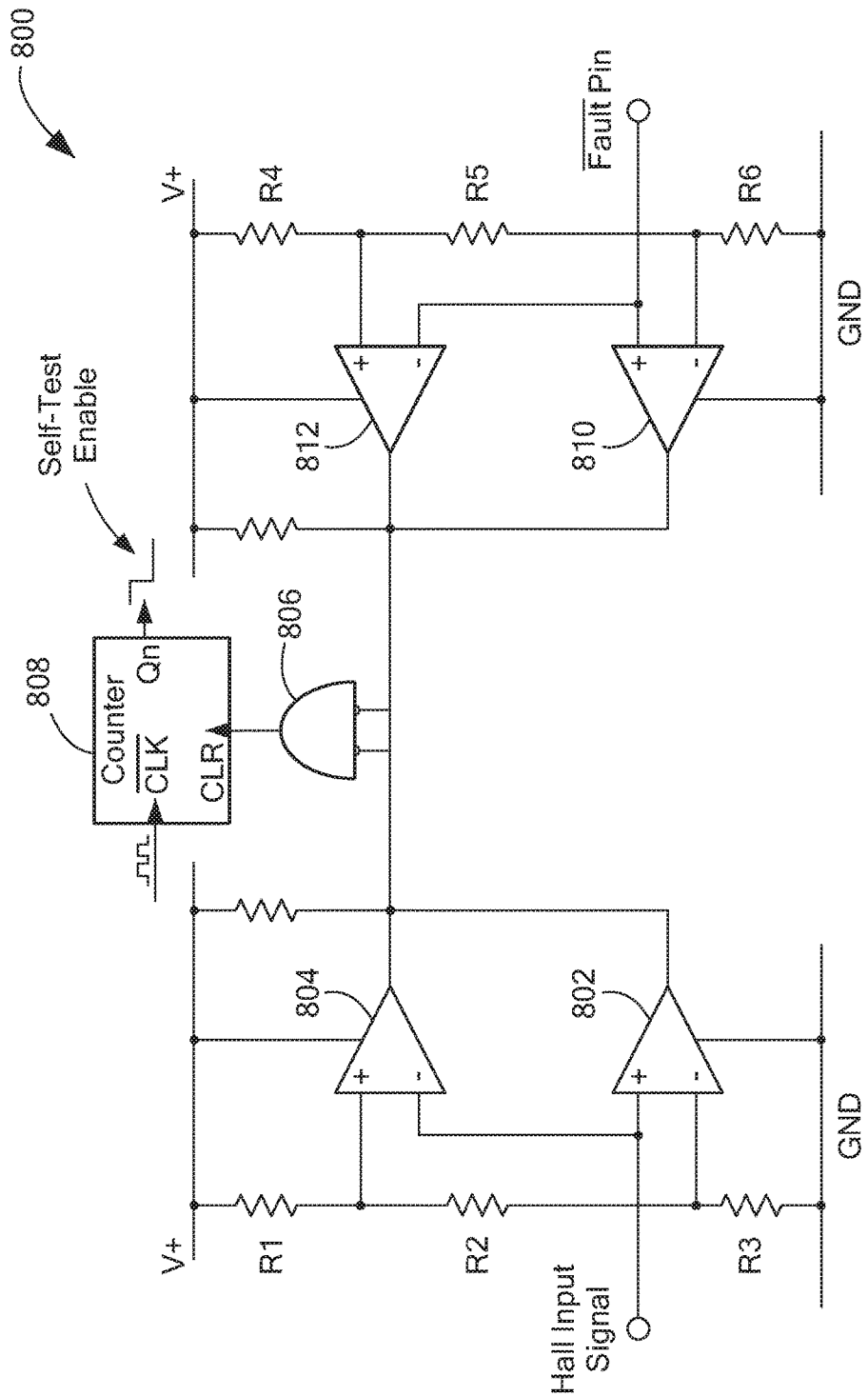
FIG. 8 is a circuit diagram of an exemplary circuit to detect a self-test initiation signal.

As shown in FIG. 8, the device can sense whether the Fault pin has been pulled to about Vcc/2, shown as $V_{ASILI}$, at the beginning of time interval $t_{ASILI}$ in FIG. 7, and no magnetic field is detected by the Hall element. In the illustrated embodiment 800, a signal from the Hall element is provided to first and second comparators 802, 804, which have respective reference voltages defined by the values of R1, R2, and R3 that determine what is considered 'zero' magnetic field. That is, the magnetic field should be less than some value. In one embodiment, resistor R2 is adjustable for setting the comparator reference voltages, e.g., a programmable window comparator. The outputs of the comparators 802, 804 are provided to an input of an AND gate 806, of which the output is provided to a clocked counter 808. The Fault pin voltage is input to third and fourth comparators 810, 812, which have respective reference voltages determined by the values of R4, R5, R6. The comparator 810, 812 outputs are provided to the AND gate 806 input. With this arrangement, when the voltage from the Hall element is around zero, and the Fault pin is pulled to about Vcc/2, the self-test function is enabled after a time defined by the counter 808.

Figure 9:
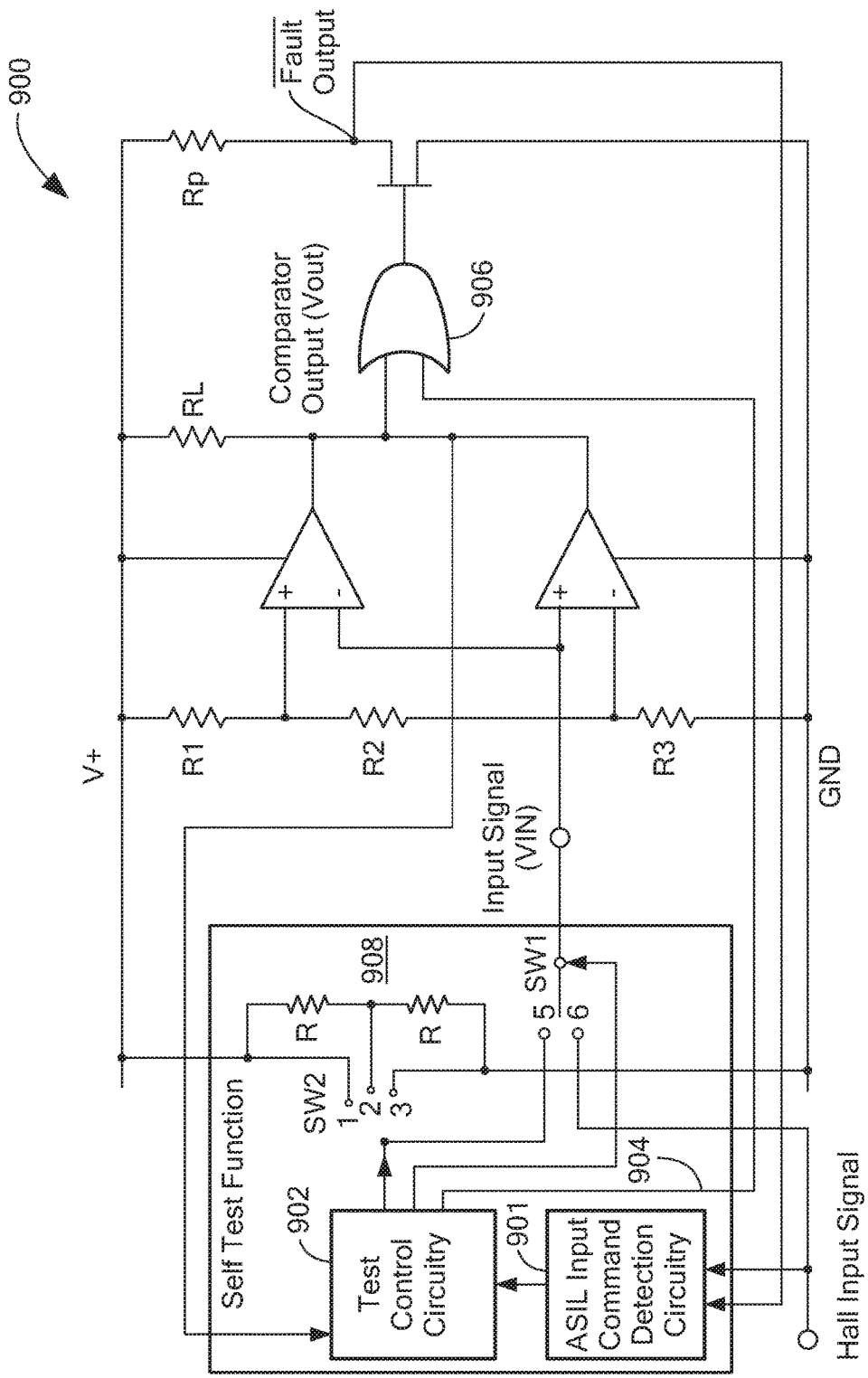
FIG. 9 is a circuit diagram of an exemplary fault detection and self-test module.

FIG. 9 shows an exemplary circuit implementation 900 of a fault detection module and self-test functionality. After a timeout period of the counter 808 (FIG. 8), shown as tASILI in FIG. 7, the device then enters the self-diagnostic mode. The counter 808 prevents noise or glitches from causing the part to go into the test mode. The timeout tASILI can be set for a desired period of time, such as a few microseconds. It is understood that the timeout tASILI can be set to any practical amount of time that is desirable to meet the needs of a particular application.

The sensor 'sees' that the self-test command was received by the output of the fault pin pulled to GND for time tASILH in FIG. 7. The chip 'sees' this because during a time when there is no magnetic field/current the FAULT output was held at Vcc/2 by for time tASILI from counter 808. The active pull down by the IC acknowledges that the command was received. If the output does not go low then the command to perform the self-test is not 'seen.' When control of the fault pin is released, the device takes control of the output pin and actively holds it to GND for time tASILH, which communicates that the self-test command was received. The time tASILH should be long enough for the device to complete the diagnostic test in order to report the results during the time tASILR, as shown in FIG. 7.

In one embodiment, the self-test functionality is implemented as shown in FIG. 9. An ASIL input command detection module 901 can be configured as shown and described in conjunction with FIGS. 7 and 8. Once the ASIL command is detected, a test control module 902 pulls the FAULT output to GND with a control signal input 904 to an OR gate 906. The test control module 902 implements the following sequence of testing while maintaining the output low (see FIG. 7) by controlling the input to the OR gate.

During self-test, the test control module 902 closes switch position 5 of a first switch SW1 so the output of a 3-position second switch SW2. Under normal operation, the first switch SW1 has position 6 closed to receive the Hall signal.

The test control module 902 controls the second switch SW2 to one of position 1 (V+), position 2 (V+/2), or position 3 (GND). The test control module 902 cycles through these connections to verify that at SW2 positions 1 and 3 the output of the fault comparator is low (fault condition present), and that at position 2 the output of the fault comparator is high (no fault). In one embodiment, the switches SW1, SW2 are provided on the IC.

Once this sequence is completed the comparator circuitry has been tested and the results can be communicated after the timeout of tASILH (see FIG. 7). More particularly, if self-test fails the device can continue to pull the output FAULT low for a period of time tASILR. In an alternative embodiment, if the self-test fails the sensor can latch the failure on the output. In the illustrated embodiment, the device holds the fault output low for a selected period of time and releases the output to enable a resumption of normal operation and further self-test. For example, it may be desirable to re-run a self-test in the case where a failure due to a glitch or noise pulse resulting a false positive test.

If self-test is successful the device drives the output HI during time tASILR labeled as self-test passing in FIG. 7. Once the self-test result during time tASILR ends, test control module 902 releases the FAULT pin by reconnecting the Hall input voltage to the fault comparator by connecting to the first switch SW1 to position 6 and clearing the input to the OR gate to a logic low to assume normal operation.

With this arrangement, the device provides a self-test diagnostic that allows for each of the three states of the comparator to be tested. The self-test can improve the functional safety level of the entire system and allow improved levels of safety according to ISO26262, for example.

In one embodiment, in the event a sensed magnetic field increases above a given threshold as detected by the Hall circuitry, the device exits test mode.

In another embodiment, the device includes circuitry to test the accuracy of the programmed fault thresholds by controlling switch positions 1 and 3 voltages close to the programmed fault thresholds and testing a short distance away from both of the thresholds. For example, say the fault threshold is programmed to a value 200 mV below V+. References of V+−200 mV+/−x mV can be used to test that the comparator switches low at +x mV and does not switch at −x mV. The value 'x' in mV can be selected to meet the needs of a particular application. It is understood that the smaller the value of 'x', the more accurately the switchpoints are tested.

Figure 10:
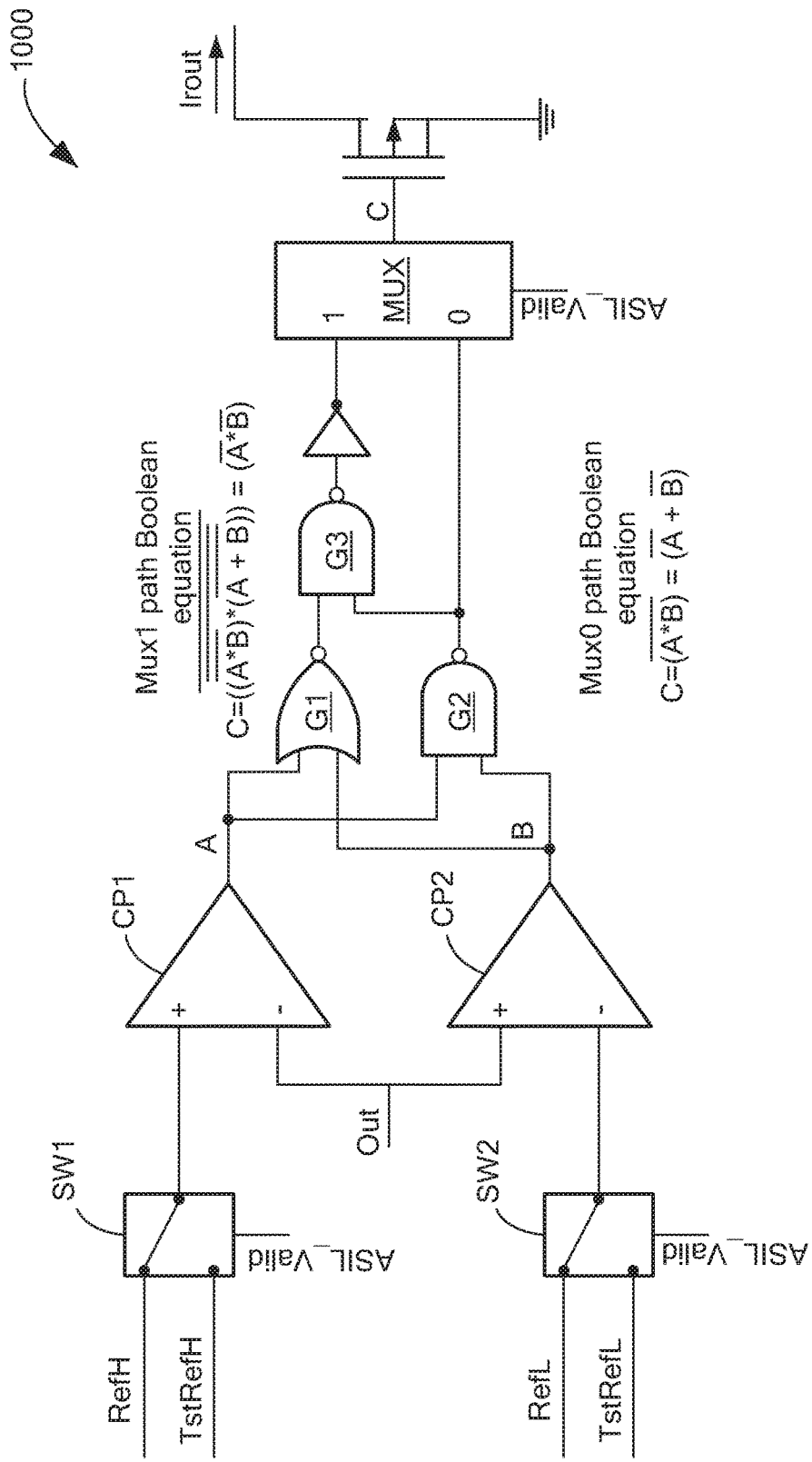
FIG. 10 is a circuit diagram an alternative self-test circuit.

An alternate embodiment 1000 of testing the window comparators is shown in FIG. 10 that tests in parallel instead of sequentially. The logic gates G1-3 and comparators CP1, CP2 must function correctly for the ASIL test to pass. During normal operation only the NAND gate G3 following the comparators CP1, CP2 is used in the Fault signal path. During normal Fault detection operation the window references RefH and RefL are used as thresholds to detect a fault condition. In ASIL test mode after the required time tASILI described above verifies that an ASIL test is being requested, the references are switched to TestRefH and TestRefL. Also, at that time, a MUX is switched to detect the alternate logic path. TestRefH and Test RefL need only be of a value that the comparators should trip as described above. In one embodiment, there is a cross connect of the two normal operation references such that TestRefH=RefL and TestRefL=RefH. This ensures that the comparators CP1, CP2 have outputs indicative of a Fault condition.

In normal Fault detection operation the switches SW1, SW2 are connected as shown and the ASIL_Valid signal is LO. The references RefH and RefL are set so that the comparator CP1, CP2 outputs are high if the device is operating in the desired output range. The Boolean equation indicated as Mux0 path is valid and point C goes high if either points A or B (the outputs of the comparators) go low indicating that a Fault has occurred.

During the ASIL test mode after the ASIL test request is valid for the period tASIL, the switches SW1, SW2 connect the comparator CP1, CP2 inputs to new reference levels TstRefH and TestRefL. The MUX 1 input is also connected to point C so the MUX 1 Boolean equation is valid in this ASIL test mode. Now both comparator CP1, CP2 outputs must be low for point C to go high. If the condition TstRefH<Out<TestRefL is met, the outputs of the comparators CP1, CP2 go low and if the logic gates are also functioning correctly then through the Boolean function C goes HI signaling that the comparators and the logic are functioning correctly.

Figure 11:
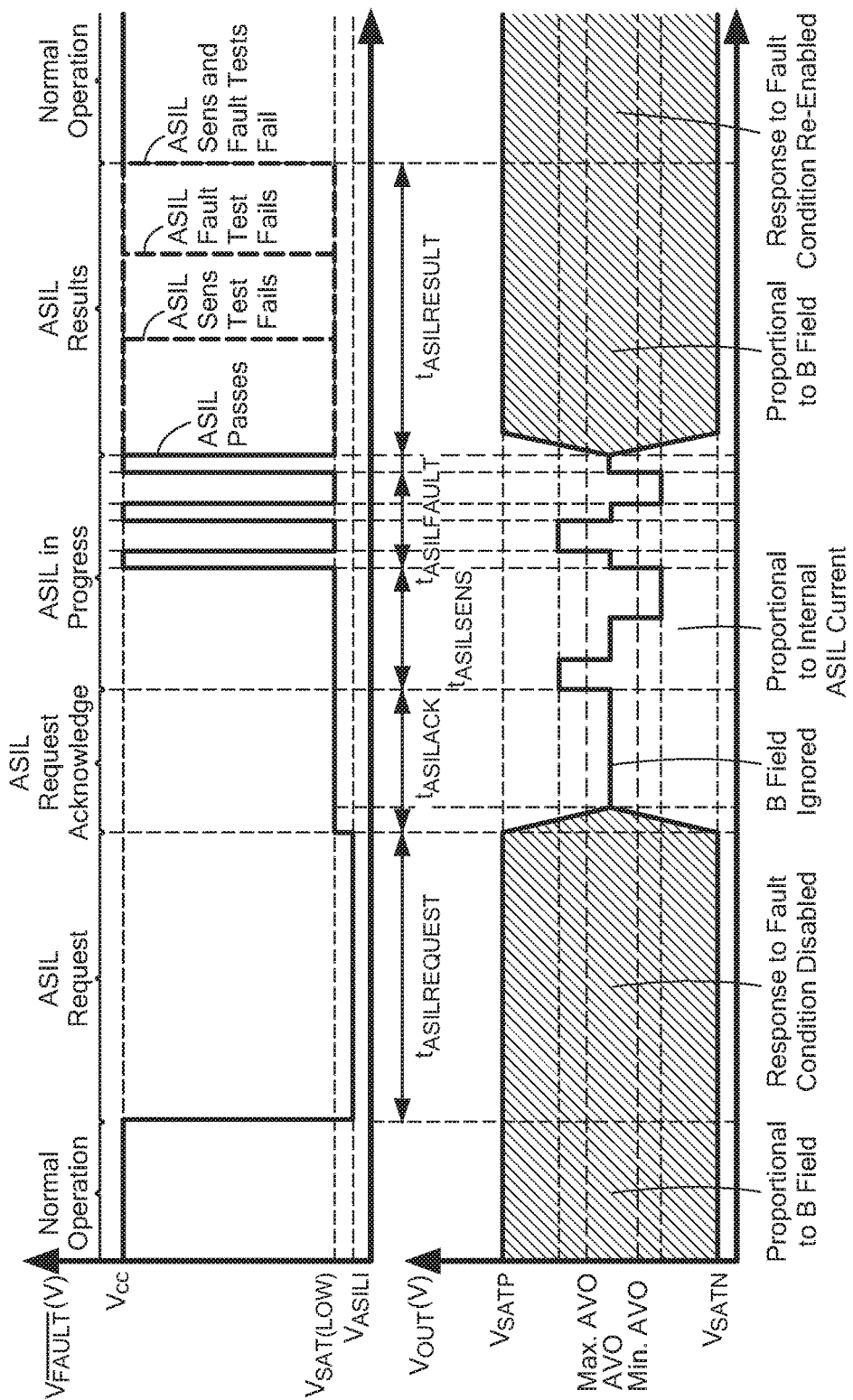
FIG. 11 is a graphical representation of self-test signal timing.

FIG. 11 shows a sequence diagram for the output signal $V_{OUT}$ and the FAULT pin with programmable self-test signals. As noted above, the FAULT pin is used as an input pin to initiate the self-test diagnostics. During normal operation the FAULT output is used to detect excessive magnetic North and South Pole fields, for example, and alert the user of the excessive fields by pulling the FAULT pin low. Since it can be used for current sensing, the device is well suited as an over-current fault feature in inverters to protect switching transistors, for example.

As shown in FIG. 11, the FAULT pin is active low and normally at Vcc when there is no fault. If the user pulls the FAULT pin to GND when there is no fault condition, then the device can detect this input and initiate self-test. As described above, a circuit can compare the voltage on the FAULT pin to the fault state. If the voltage on the FAULT pin is low and the IC is not pulling this pin low, then the IC determines that the user is trying to enter into diagnostic mode.

In an exemplary embodiment, self-test can occur in a number of ways. For example, the user can initiate self-test at a time when the magnetic field is near zero. When the command is received, the IC can choose to ignore input fields and respond only to the internally generated stimulus for self-testing, as shown in the illustrated embodiment. The external fields are ignored and the output responds only to the self-test internally generated signals.

In addition, the user can initiate self-test at any time and the IC can respond to external fields. This superimposes the internally generated signal on the externally influenced magnetic signal. As long as the input signal is small enough, the response signal can 'ride on top' of the external field signal and not saturate the output.

In exemplary embodiments of the invention, the self-test timing sequence is programmable. When the user gives the command to start self test, the FAULT pin is held low for a period of time tASILREQUEST. Once this time expires, the chip has successfully given the command to start self-test and acknowledges that the command was received. To acknowledge, the sensor holds the output $V_{OUT}$ low for a time tASILACK. The user can observe the acknowledge signal by releasing control of the FAULT pin and observing that the pin is still held low.

In the illustrated embodiment, the output $V_{OUT}$ is also near the zero field level as it is ignoring external fields. It is understood that ignoring external fields during this time is not necessary. After acknowledging the command to initiate self-test during tASILACK, the device begins self-test and tests the analog signal path during time tASILSENS and the fault output during tASILFAULT. During this time a series of pulses appear on the analog output $V_{OUT}$ and the FAULT pin output. The user can observe these outputs for the correct behavior to determine if the test was successful. The device can also report the results of the testing during time tASILRESULT as the IC itself can also monitor the results of the test and report it on the fault output.

Figure 11A:
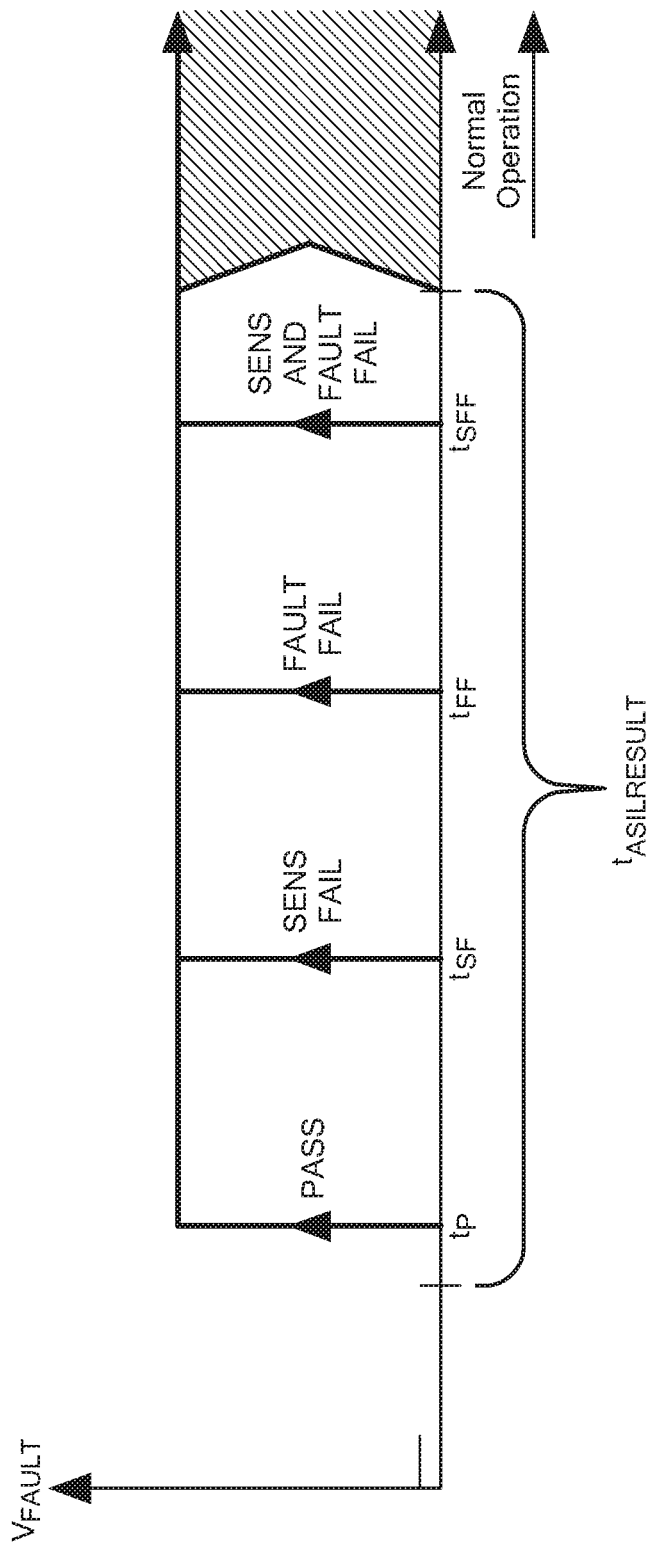
FIG. 11A is a graphical representation of further detail of self-test signal timing.

In an exemplary embodiment, during time tASILRESULT, the time at which a pulse appears on the FAULT pin indicates the result of the self-test. In the illustrated embodiment of FIG. 11A, a transition of the FAULT pin at time tP indicates self-test pass. A transition at time tSF indicates a sensor test failure. A transition at time tFF indicates a Fault failure. A transition at time tSFF indicates sensor and fault failure. The system coupled to the sensor looks for a transition on the FAULT pin in relation to the beginning of tASILRESULT, for example, to determine the test result.

In exemplary embodiments, the transitions can be of any order and of programmable location and duration. In general, the sensor signals can be adapted to meet the requirements of ECUs or other systems in communication with the sensor.

Once time tASILRESULT expires, the chip resumes normal operation. Independent of the test sequence is the ability to program the timing of each sequence, such as tASILREQUEST, tASILACK, tASILSENS, tASILFAULT, and/or tASILRESULT. Making the sequence items programmable within the range of say 50 μs to 500 mS or 1 second allows for timing compliance using different ECU (Engine Control Units) control platforms, for example. Programming the timing of the pulses allows for maximum flexibility.

Programming the width of the test pulses provides additional flexibility. These widths could be programmed for instance between 50 μs to 50 mS.

In alternative embodiments, a dedicated pin can be used to initiate self-test when available, such as in a TSSOP package (FIG. 12B). In another embodiment, a three-pin package is used in which output levels are measured in high, low and other diagnostic states.

One way to initiate self-test is at power up of the sensor. In embodiments coupled to an ECU, the control ECU powers up first, then the ECU, and then the subsystems. It may be convenient for the device to initiate self-test upon power-up for many systems. Where no input is needed to initiate testing, programming of each individual timing element of the testing provides maximum flexibility and compatibility with ECU control platforms.

In one embodiment, the device initiates self-test whenever the output of the device is near zero field for a specified time, say greater than 1 ms or 10 ms. In this case, the sensor is always in diagnostic mode when no field is present and can be observed during the most convenient time for observing the output. The device can come out of self-test when it observes a field applied, say more than 5% of full scale. Programming the timing sequence provides maximum flexibility.

In another embodiment, the device initiates self-test whenever the temperature changes by more than a specified amount; say more than 25 degrees Celsius to provide feedback that the device is operating normally over temperature.

In a further embodiment, the device initiates self-test on a regular basis as determined by a continuously running system clock. In this case the IC conducts a self-test whenever the counter hits a certain value. Then the counter would be reset and start counting again. The counter value can be programmable.

In another embodiment, in the case of an IC with a bi-directional communication protocol, such as SPI or I2C, the user can choose when self diagnostics occur based on a digital command that is sent to the sensor on the communication bus.

FIG. 12A shows an exemplary device packaged in a 4 lead KT SIP and FIG. 12B shows and exemplary surface mount TSSOP package. It is understood that the IC can comprise any suitable package. In one embodiment, the package has a thickness of less than about 1.1 mm. It is understood that it is desirable to minimize the thickness of the package. FIG. 12C shows an exemplary terminal listing for the KT and LE packages.

It is understood that a variety of packages can be used to meet the needs of a particular application. For example, a package of the type shown and described in U.S. Pat. No. 6,781,359, which is incorporated herein by reference, can be used.

Figure 12D:
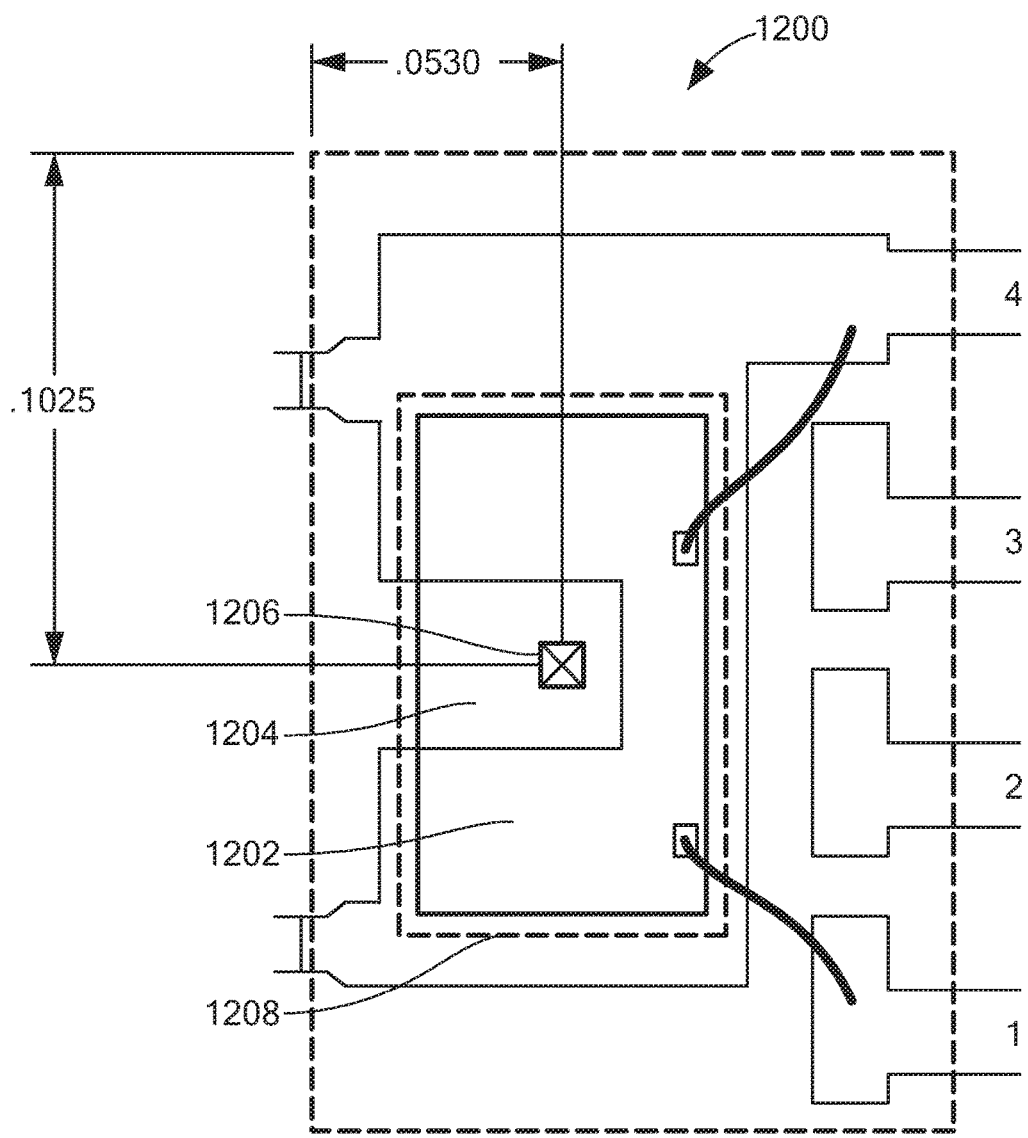
FIG. 12D is a schematic representation of a leadframe that can form a part of an IC.

FIG. 12D shows an exemplary split leadframe 1200 configuration in which a leadframe 1202 has a region 1204 cutout from the rest of the leadframe. A magnetic sensing element 1206 is located within the region 1204 to prevent Eddy current formation in the vicinity of the sensing element. A die 1208 can be supported by the leadframe.

Figure 12E:
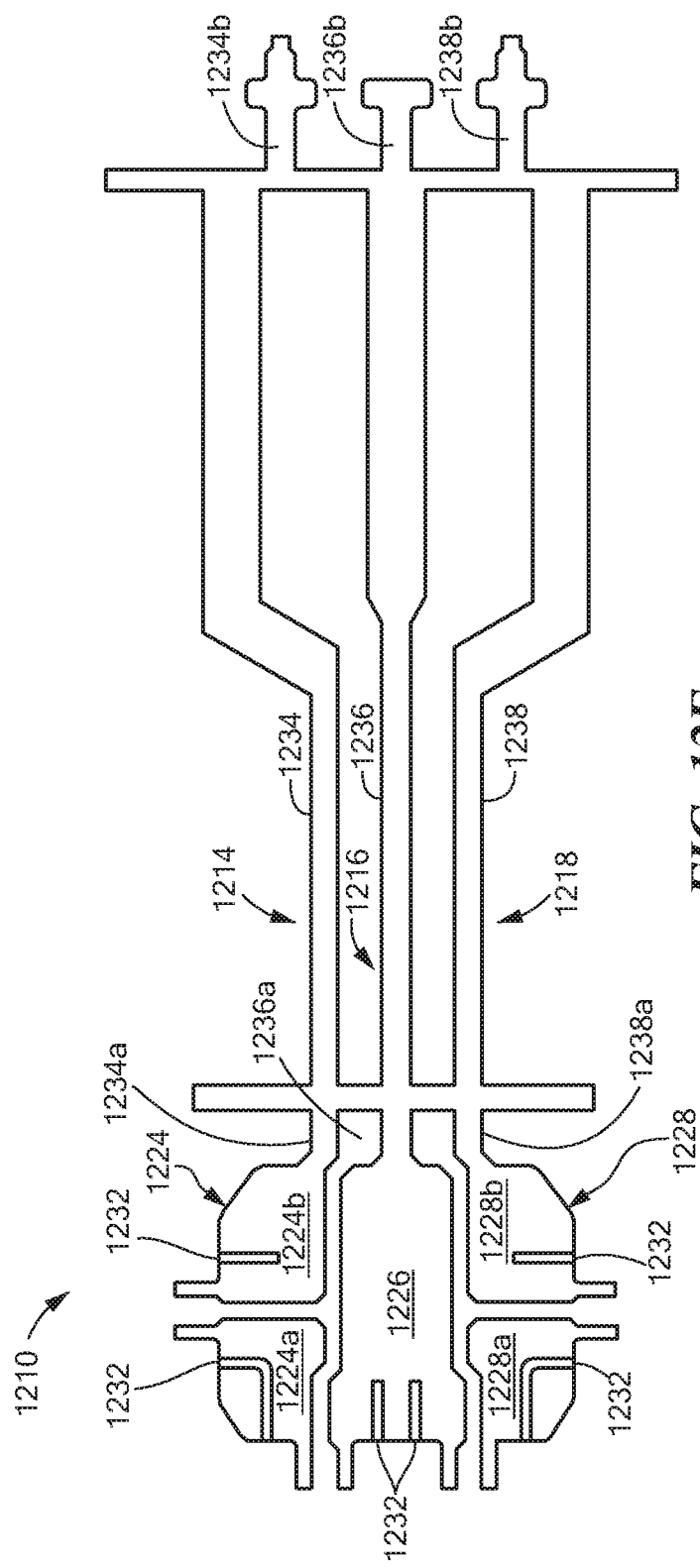
FIG. 12E is a schematic representation of a leadframe that can form part of an IC, on portions of which a die is placed across a die attach portion of the leads to create a split paddle.

In another embodiment shown in FIG. 12E, the lead frame may not have a die attach paddle as shown in FIG. 12D, but rather may just have portions where the die is placed across a die attach portion of the leads to create a split paddle, for example as shown in U.S. Patent Publication No. 2014/0320124, filed on Apr. 26, 2013, which is incorporated herein by reference. A lead frame 1210 for use in an integrated circuit includes a plurality of leads 1214, 1216, 1218 at least two of which (and here, all three) include a respective die attach portion 1224, 1226, 1228 and connection portion 1234, 1236, 1238. The lead frame 1210 has a first surface 1210a and a second, opposing surface (not shown). The die attach portion 1224, 1226, 1228 of the leads (referred to herein sometimes as simply the die portion) can have a semiconductor die 1240 (not shown) attached thereto. While the lead frame 1210 is shown to include three leads 1214, 1216, 1218, it will be appreciated by those of ordinary skill in the art that various numbers of leads, such as between two and eight, are possible.

The connection portion 1234, 1236, 1238 of the leads extends from a first end 1234a, 1236a, 1238a proximate to the respective die portion 1224, 1226, 1228 to a second, distal end 1234b, 1236b, 1238b distal from the die portion. Generally, the connection portion 1234, 1236, 1238 of the leads is elongated and is suitable for making electrical connection to electronic systems and components (not shown) outside of the integrated circuit package, such as a power source or microcontroller. The die attach portion of one or more of the leads further may further include at least one separating feature 1232 that separates areas of a die attach portion from each other.

Figure 13:
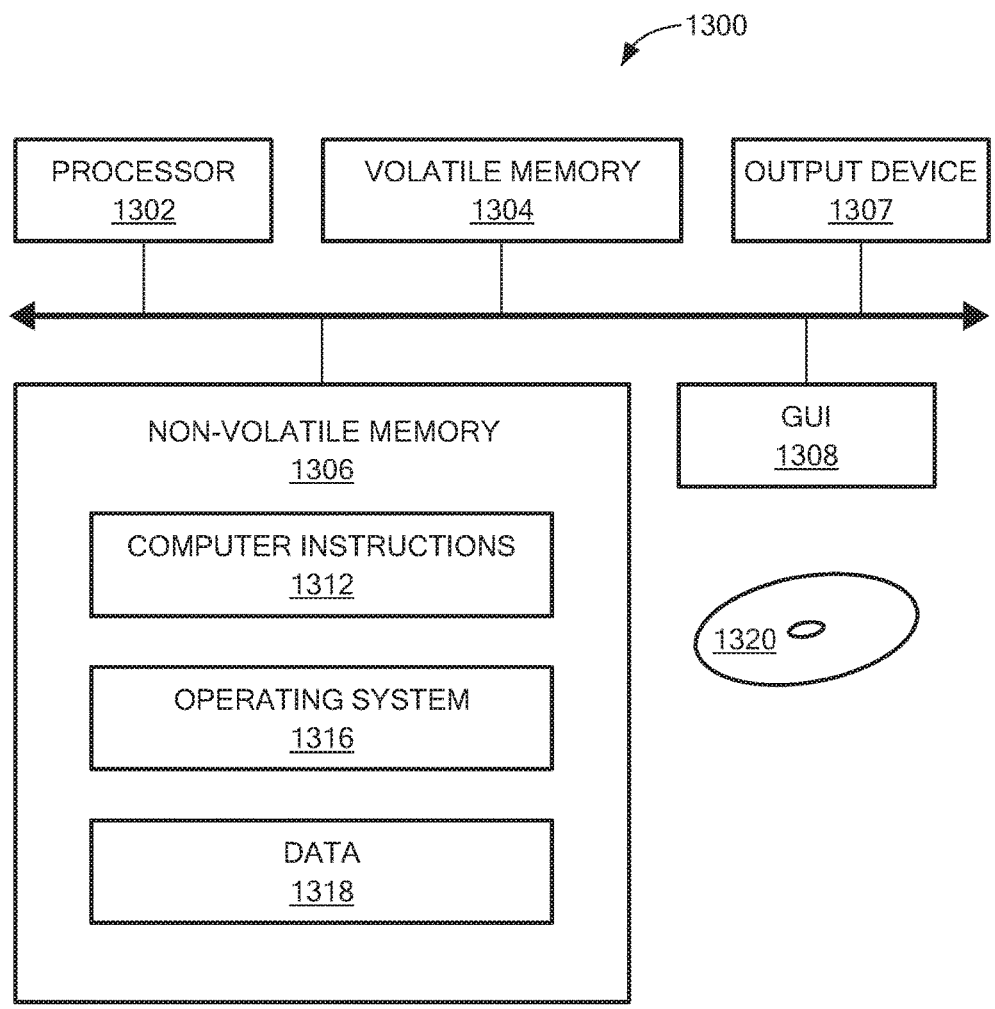
FIG. 13 is a schematic representation of an exemplary computer that can perform at least a portion of the processing described herein.

FIG. 13 shows an exemplary computer 1300 that can perform at least part of the processing described herein. The computer 1300 includes a processor 1302, a volatile memory 1304, a non-volatile memory 1306 (e.g., hard disk), an output device 1307 and a graphical user interface (GUI) 1308 (e.g., a mouse, a keyboard, a display, for example). The non-volatile memory 1306 stores computer instructions 1312, an operating system 1316 and data 1318. In one example, the computer instructions 1312 are executed by the processor 1302 out of volatile memory 1304. In one embodiment, an article 1320 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

What is claimed is:

1. An integrated circuit, comprising:
a magnetic sensing element;
fault detection module coupled to the sensing element, the fault detection module including circuitry to detect a fault condition and to self-test operation of the circuitry for detecting the fault condition; and
a fault pin to indicate the fault condition, wherein the fault pin comprises an input/output pin such that pulling the fault pin to a given voltage level for a given time provides a self-test request to initiate the self-test operation, and
wherein the fault detection module includes at least one switch to cycle through connections to known voltage and ground signals and verify expected fault and no fault signals on the fault pin for the self-test operation of the circuitry for detecting the fault condition.

2. The integrated circuit according to claim 1, wherein the fault detection module includes a window comparator having at least one threshold associated with the fault condition.

3. The integrated circuit according to claim 2, wherein the at least one threshold corresponds to a short circuit.

4. The integrated circuit according to claim 3, wherein the short circuit is located in a signal path extending from the window comparator to the magnetic sensing element.

5. The integrated circuit according to claim 2, wherein the fault pin is activated to a given state upon fault detection by the at least one threshold.

6. The integrated circuit according to claim 1, wherein self-test signals of the self-test operation are programmable in duration.

7. A method, comprising:
coupling a magnetic sensing element to fault detection module in an integrated circuit;
providing the fault detection module to include circuitry to detect a fault condition and to self-test operation of the circuitry for detecting the fault condition;
providing self-test signals; and
providing a fault pin to indicate the fault condition,
wherein the fault pin comprises an input/output pin such that pulling the fault pin to a given voltage level for a given time provides a self-test request to initiate the self-test operation, and
wherein the fault detection module includes at least one switch to cycle through connections to known voltage and ground signals and verify expected fault and no fault signals on the fault pin for the self-test operation of the circuitry for detecting the fault condition.

8. The method according to claim 7, wherein the fault detection module includes a window comparator having at least one threshold associated with the fault condition.

9. The method according to claim 8, wherein the at least one threshold corresponds to a short circuit condition.

10. The method according to claim 9, wherein the short circuit condition is located in a signal path extending from the window comparator to the magnetic sensing element.

11. The method according to claim 8, wherein the fault pin is activated to a given state upon fault detection by the at least one threshold.

12. The method according to claim 8, wherein the fault condition includes a current level above a threshold.

13. The method according to claim 8, wherein the given time of the self-test request is programmable.

14. The method according to claim 8, wherein the given time of the self-test request corresponds to power up initiation of self-test request.

15. The method according to claim 8, wherein the self-test operation is entered only when an applied magnetic field is below a magnetic field threshold.

16. The method according to claim 8, further including controlling a voltage on the fault pin to provide an acknowledge signal indicating entrance into the self-test operation.

17. The method according to claim 16, wherein an amount of time the acknowledge signal is active is programmable.

18. The method according to claim 16, further including controlling the voltage level on the fault pin to provide results from the self-test operation.

19. The method according to claim 18, further including timing the voltage level on the fault pin to indicate a pass or a fail of the self-test operation.

20. The method according to claim 19, wherein a transition of the voltage level at a first time indicates pass, a transition of the voltage level at a second indicates a sensor test fail, and a transition of the voltage level at a third time indicates a fault failure.

21. The method according to claim 20, wherein the first, second, and third times are programmable.

22. The method according to claim 7, further including initiating the self-test operation after a temperature change of greater than a temperature threshold.

23. The method according to claim 7, wherein the integrated circuit comprises a package having exactly four pins.

24. The method according to claim 7, further including employing a die supported by a leadframe having a region cutout from the leadframe, wherein the location of the magnetic sensing element is aligned with the region to reduce Eddy currents.

25. The method according to claim 7, wherein the self-test is terminated when a magnetic field above a flux threshold is detected.

26. The method according to claim 7, wherein the integrated circuit comprises a linear current sensor.

27. The method according to claim 7, wherein self-test signals of the self-test operation are programmable in duration.

28. An integrated circuit, comprising:
a magnetic sensing element;
fault detection module coupled to the sensing element, the fault detection module including circuitry to detect a fault condition and to self-test operation of the circuitry for detecting the fault condition, wherein the fault detection module includes a window comparator having at least one threshold associated with the fault condition; and
a fault pin to indicate the fault condition,
wherein the fault pin comprises an input/output pin such that pulling the fault pin to a given voltage level for a given time provides a self-test request to initiate the self-test operation, and wherein the fault detection module includes at least one switch to cycle through connections to known voltage and ground signals and verify expected fault and no fault signals on the fault pin for the self-test operation of the circuitry for detecting the fault condition.

* * * * *

UNITED STATES PATENT AND TRADEMARK OFFICE
CERTIFICATE OF CORRECTION

| | |
|---|---|
| PATENT NO. | : 9,910,088 B2 |
| APPLICATION NO. | : 14/578813 |
| DATED | : March 6, 2018 |
| INVENTOR(S) | : Shaun Milano et al. |

It is certified that error appears in the above-identified patent and that said Letters Patent is hereby corrected as shown below:

Column 6, Line 21, delete "diagram an" and replace with --diagram of an--.

Column 6, Line 67 to Column 7, Lines 1-5, delete "As is known, there are different types of Hall Effect elements, for example, a planar Hall element, a vertical Hall element, and a Circular Vertical Hall (CVH) element. As is known, there are different types of Hall Effect elements, for example, a planar Hall element, a vertical Hall element, and a Circular Vertical Hall (CVH) element." and replace with --As is known, there are different types of Hall Effect elements, for example, a planar Hall element, a vertical Hall element, and a Circular Vertical Hall (CVH) element.--.

Column 12, Line 64, delete "tASILI During" and replace with --$t_{ASILI}$. During--.

Column 13, Line 31, delete "tASILI" and replace with --$t_{ASILI}$--.

Column 13, Line 34, delete "tASILI" and replace with --$t_{ASILI}$--.

Column 13, Line 36, delete "tASILI" and replace with --$t_{ASILI}$--.

Column 13, Line 40, delete "tASILH" and replace with --$t_{ASILH}$--.

Column 13, Line 43, delete "tASILI" and replace with --$t_{ASILI}$--.

Column 13, Line 48, delete "tASILH," and replace with --$t_{ASILH}$,--.

Column 13, Line 50, delete "tASILH" and replace with --$t_{ASILH}$--.

Column 13, Line 52, delete "tASILR," and replace with --$t_{ASILR}$,--.

Column 14, Line 9, delete "tASILH" and replace with --$t_{ASILH}$--.

Column 14, Line 11, delete "tASILR." and replace with --$t_{ASILR}$.--.

Signed and Sealed this
Tenth Day of July, 2018

Andrei Iancu
*Director of the United States Patent and Trademark Office*

CERTIFICATE OF CORRECTION (continued)
U.S. Pat. No. 9,910,088 B2

Column 14, Line 20, delete "tASILR" and replace with --$t_{ASILR}$--.

Column 14, Line 21, delete "tASILR" and replace with --$t_{ASILR}$--.

Column 14, Line 55, delete "tASILI" and replace with --$t_{ASILI}$--.

Column 14, Line 57, delete "TestRefH and TestRefL." and replace with --TstRefH and TstRefL.--.

Column 14, Line 59, delete "TestRefH and Test RefL" and replace with --TstRefH and TstRefL--.

Column 14, Lines 62-63, delete "TestRefH=RefL and TestRefL=RefH." and replace with --TstRefH=RefL and TstRefL=RefH.--.

Column 15, Line 7, delete "tASIL," and replace with --$t_{ASIL}$,--.

Column 15, Line 9, delete "TestRefL." and replace with --TstRefL.--.

Column 15, Line 13, delete "TstRefH<Out<TestRefL" and replace with --TstRefH<Out<TstRefL--.

Column 15, Line 54, delete "tASILREQUEST." and replace with --$t_{ASILREQUEST}$.--.

Column 15, Line 58, delete "tASILACK." and replace with --$t_{ASILACK}$.--.

Column 15, Line 65, delete "tASILACK," and replace with --$t_{ASILACK}$,--.

Column 15, Line 66, delete "tASILSENS" and replace with --$t_{ASILSENS}$--.

Column 15, Line 67, delete "tASILFAULT." and replace with --$t_{ASILFAULT}$.--.

Column 16, Lines 4-5, delete "tASIL-RESULT" and replace with --$t_{ASILRESULT}$--.

Column 16, Lines 7-8, delete "tASILRE-SULT," and replace with --$t_{ASILRESULT}$,--.

Column 16, Line 10, delete "tP" and replace with --$t_P$--.

Column 16, Line 11, delete "tSF" and replace with --$t_{SF}$--.

Column 16, Line 12, delete "tFF" and replace with --$t_{FF}$--.

Column 16, Line 13, delete "tSFF" and replace with --$t_{SFF}$--.

Column 16, Line 16, delete "tASILRESULT," and replace with --$t_{ASILRESULT}$,--.

Column 16, Line 23, delete "tASILRESULT" and replace with --$t_{ASILRESULT}$--.

CERTIFICATE OF CORRECTION (continued)
U.S. Pat. No. 9,910,088 B2

Column 16, Lines 26-27, delete "tASILREQUEST, tASILACK, tASILSENS, tASILFAULT, and/or tASILRESULT." and replace with --$t_{ASILREQUEST}$, $t_{ASILACK}$, $t_{ASILSENS}$, $t_{ASILFAULT}$, and/or $t_{ASILRESULT}$.--.

Column 17, Line 53, delete "leads further may further" and replace with --leads may further--.